(12) United States Patent
Sakamoto et al.

(10) Patent No.: US 12,295,110 B2
(45) Date of Patent: May 6, 2025

(54) FOLDABLE DISPLAY AND METHOD FOR MANUFACTURING FOLDABLE DISPLAY

(71) Applicant: Sharp Kabushiki Kaisha, Sakai (JP)

(72) Inventors: Mayuko Sakamoto, Sakai (JP); Edward Boardman, Oxford (GB); Tokio Taguchi, Sakai (JP); Ikuo Ninomiya, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 232 days.

(21) Appl. No.: 18/028,006

(22) PCT Filed: Sep. 30, 2020

(86) PCT No.: PCT/JP2020/037177
§ 371 (c)(1),
(2) Date: Mar. 23, 2023

(87) PCT Pub. No.: WO2022/070316
PCT Pub. Date: Apr. 7, 2022

(65) Prior Publication Data
US 2023/0345652 A1    Oct. 26, 2023

(51) Int. Cl.
*H05K 5/02*    (2006.01)

(52) U.S. Cl.
CPC ................... *H05K 5/0217* (2013.01)

(58) Field of Classification Search
CPC .... H05K 5/0217; G06F 1/1652; G06F 1/1637
See application file for complete search history.

(56) References Cited

U.S. PATENT DOCUMENTS

| | | | | |
|---|---|---|---|---|
| 11,031,563 | B1* | 6/2021 | Li | H10K 77/111 |
| 11,048,295 | B1* | 6/2021 | Smeeton | G09F 9/301 |
| 11,175,693 | B2* | 11/2021 | Song | G09G 3/3208 |
| 11,455,915 | B2* | 9/2022 | Cho | G06F 1/1656 |
| 11,469,386 | B2* | 10/2022 | Min | H10K 77/111 |

(Continued)

FOREIGN PATENT DOCUMENTS

JP    2020-021092 A    2/2020

*Primary Examiner* — Sagar Shrestha
(74) *Attorney, Agent, or Firm* — Keating & Bennett, LLP

(57) ABSTRACT

A foldable display includes: a flexible display panel including: an impact absorbing layer including a metal film; and a display layer provided on a surface of the impact absorbing layer; a first region, a second region, and a third region that are included in a region of the flexible display panel, the third region being positioned between the first region and the second region; a first support substrate that is inflexible, the first support substrate supporting the first region from toward the impact absorbing layer; a second support substrate that is inflexible, the second support substrate supporting the second region from toward the impact absorbing layer; a folding mechanism connected to the first support substrate and the second support substrate, and overlapping with the third region in plan view; and a slit provided to the metal film at least in a first position at a shortest distance, from the third region, shorter than a shortest distance from an end portion of the first region across from the third region, or in a second position at a shortest distance, from the third region, shorter than a shortest distance from an end portion of the second region across from the third region.

20 Claims, 15 Drawing Sheets

(56) References Cited

U.S. PATENT DOCUMENTS

| | | | |
|---|---|---|---|
| 11,546,986 B2* | 1/2023 | Wang | H05K 1/028 |
| 11,907,019 B2* | 2/2024 | Soh | G06F 1/1652 |
| 11,950,379 B2* | 4/2024 | Kim | G06F 1/18 |
| 12,075,689 B2* | 8/2024 | Seo | G02F 1/133305 |
| 12,159,557 B2* | 12/2024 | Park | G09F 9/301 |
| 2017/0315589 A1* | 11/2017 | Isa | G06F 1/1675 |
| 2018/0102496 A1* | 4/2018 | Kim | H10K 50/87 |
| 2018/0190936 A1* | 7/2018 | Lee | B32B 3/30 |
| 2018/0192527 A1* | 7/2018 | Yun | G09F 9/301 |
| 2019/0036068 A1* | 1/2019 | Kim | G06F 1/1601 |
| 2020/0295282 A1* | 9/2020 | Xiang | H10K 71/00 |
| 2020/0313111 A1* | 10/2020 | Kim | G06F 1/1626 |
| 2022/0269310 A1* | 8/2022 | Xiong | H10K 77/111 |
| 2023/0034440 A1* | 2/2023 | Xie | G09F 9/301 |

* cited by examiner

FOLDABLE DISPLAY AND METHOD FOR MANUFACTURING FOLDABLE DISPLAY

TECHNICAL FIELD

The present disclosure relates to a foldable display and method for manufacturing a foldable display.

BACKGROUND ART

In recent years, foldable displays including flexible display panels have attracted considerable attention. Such flexible display panels include, as light-emitting elements, for example, organic light-emitting diodes (OLEDs) or quantum-dot light-emitting diodes (QLEDs).

However, a problem of the foldable displays is that their durability is unsatisfactory, and studies have been actively conducted to increase the durability.

For example, Patent Document 1 describes a foldable display including: a flexible display panel; a plate made of stainless steel; and a plurality of gears under a folding region of the plate.

CITATION LIST

Patent Literature

[Patent Document 1] Japanese Unexamined Patent Application Publication No. 2020-021092

SUMMARY

Technical Problem

The foldable display described in Patent Document 1 is devised to have the whole folding region provided with a plurality of opening portions formed of a plurality of gears, so that the foldable display is readily bent. However, in such a structure, the whole folding region is provided with the plurality of openings formed of the plurality of gears. That is why the foldable display is vulnerable to impact.

An aspect of the present disclosure is conceived in view of the above problem, and is intended to provide a foldable display highly resistant to impact and bending, and a method for manufacturing the foldable display.

Solution to Problem

In order to solve the above problem, a foldable display of the present disclosure includes:
- a flexible display panel including: an impact absorbing layer including a metal film; and a display layer provided on a surface of the impact absorbing layer;
- a first region, a second region, and a third region that are included in a region of the flexible display panel, the third region being positioned between the first region and the second region;
- a first support substrate that is inflexible, the first support substrate supporting the first region from toward the impact absorbing layer;
- a second support substrate that is inflexible, the second support substrate supporting the second region from toward the impact absorbing layer;
- a folding mechanism connected to the first support substrate and the second support substrate, and overlapping with the third region in plan view; and
- a slit provided to the metal film at least in a first position at a shortest distance, from the third region, shorter than a shortest distance from an end portion of the first region across from the third region, or in a second position at a shortest distance, from the third region, shorter than a shortest distance from an end portion of the second region across from the third region.

In order to solve the above problem, a method for manufacturing a foldable display includes:
- a step of forming a flexible display panel including a display layer provided on a surface of an impact absorbing layer including a metal film; and
- a fastening step of fastening a first region of the flexible display panel to a first support substrate, which is inflexible, from toward the impact absorbing layer, and a second region of the flexible display panel to a second support substrate, which is inflexible, from toward the impact absorbing layer, and of overlapping a third region of the flexible display panel with a folding mechanism in plan view, the third region being positioned between the first region and the second region, and the folding mechanism being connected to the first support substrate and the second support substrate,
wherein the step of forming the flexible display panel further includes a step of providing a slit to the metal film at least in a first position or a second position, the first position being at a shortest distance, from the third region, shorter than a shortest distance from an end portion of the first region across from the third region, and the second position being at a shortest distance, from the third region, shorter than a shortest distance from an end portion of the second region across from the third region.

Advantageous Effects of Disclosure

An aspect of the present disclosure can provide a foldable display highly resistant to impact and bending, and a method for manufacturing the foldable display.

BRIEF DESCRIPTION OF DRAWINGS

FIG. 4(a), FIG. 4 (b), and FIG. 4(c) are cross-sectional views showing schematic configurations of modifications of flexible display panels that can be included in the foldable display of the first embodiment.

DESCRIPTION OF EMBODIMENTS

Embodiments of the disclosure are described below, with reference to FIGS. 1 to 19. For convenience in description, identical reference signs denote features having identical configurations between specific embodiments. Description of such features might be omitted.

First Embodiment

Figure 1:
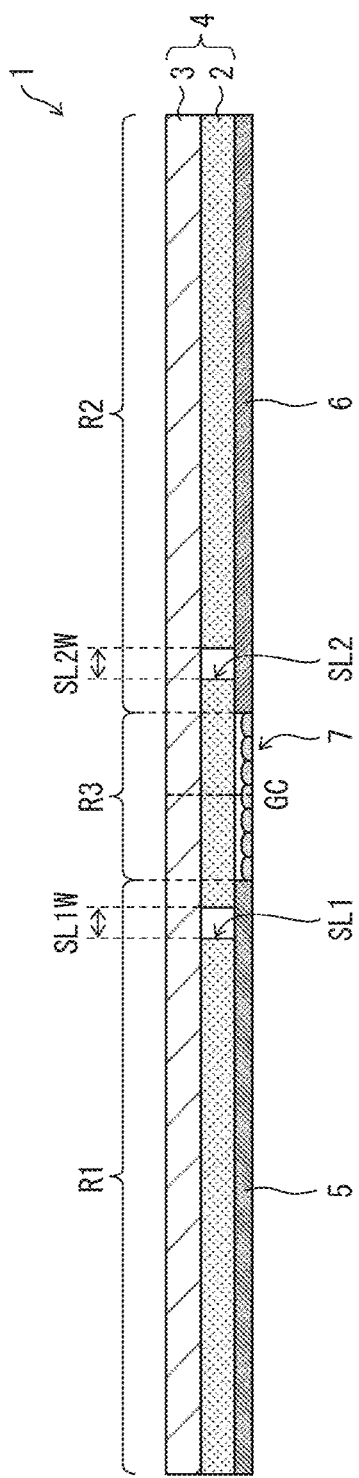
FIG. 1 is a cross-sectional view showing a schematic configuration of a foldable display of a first embodiment.

FIG. 1 is a cross-sectional view showing a schematic configuration of a foldable display 1 of a first embodiment.

As illustrated in FIG. 1, the foldable display 1 includes a flexible display panel 4 including: an impact absorbing layer 2 including a metal film; and a display layer 3 provided on a surface of the impact absorbing layer 2.

The flexible display panel 4 includes: a first region R1; a second region R2; and a third region R3 positioned between the first region R1 and the second region R2.

The foldable display 1 further includes: a first support substrate 5 that is an inflexible substrate supporting the first region R1 of the flexible display panel 4 from toward the impact absorbing layer 2; a second support substrate 6 that is an inflexible substrate supporting the second region R2 of the flexible display panel 4 from toward the impact absorbing layer 2; and a folding mechanism 7 connected to the first support substrate 5 and the second support substrate 6, and overlapping with the third region R3 in plan view.

The impact absorbing layer 2 in the first region R1 of the flexible display panel 4 included in the foldable display 1 is provided with a slit SL1. The impact absorbing layer 2 in the second region R2 of the flexible display panel 4 included in the foldable display 1 is provided with a slit SL2.

Note that, as illustrated in FIG. 1, the foldable display 1 has a bending center GC in the third region R3. The bending center GC is a horizontal center of the third region R3 in the drawing.

The impact absorbing layer 2 is provided to absorb impact on the foldable display 1, and has to include at least a metal film. Including the metal film, the impact absorbing layer 2 can obtain an advantageous effect of absorbing impact on the foldable display 1 together with another layer, for example, an organic layer, included in the foldable display 1.

This embodiment exemplifies a case where the impact absorbing layer 2 includes: a metal film; an adhesive layer provided on a surface of the metal film; and an adhesive layer provided on another surface of the metal film. However, this embodiment shall not be limited to such a case. For example, the impact absorbing layer 2 does not have to include at least one of the adhesive layers. As will be described later in an embodiment, the impact absorbing layer 2 may further include a polymer film.

The display layer 3 is a flexible layer. In this embodiment, the display layer 3 includes, for example: organic light-emitting diodes (OLEDs) as light-emitting elements; TFT elements that control the light-emitting elements; capacitive elements; and lines for these elements. However, the display layer 3 shall not be limited to such an example. For example, as the light-emitting elements, the display layer 3 may include either quantum-dot light-emitting diodes (QLEDs) instead of OLEDs, or both OLEDs and QLEDs. Moreover, instead of the light-emitting elements, the display layer 3 may include a reflective liquid crystal display layer. That is, the display layer 3 is any given display layer as long as the display layer is flexible.

Note that if the display layer 3 includes, as the light-emitting elements, either OLEDs or QLEDs, the display layer 3 preferably further includes a sealing layer that covers these light-emitting elements. The sealing layer can include, for example, a first inorganic layer, an organic layer, and a second inorganic layer. However, the sealing layer shall not be limited to such an example, and may be formed of an inorganic film alone or of an organic film alone.

Although not shown, the foldable display 1 may also include, for example, a flexible cover provided on a surface of the display layer 3 (an upper surface of the display layer 3 in FIG. 1) across from another surface of the display layer 3 toward the impact absorbing layer 2. The flexible cover protects the flexible functional layer (e.g., a touch panel) and the display layer 3. An example of the flexible cover includes a known hard-coated window film.

Each of the first support substrate 5 and the second support substrate 6 may be formed of any given material as long as the material is inflexible. Preferably, each of the first support substrate 5 and the second support substrate 6 includes therein a space capable of storing a power supply (e.g., a battery) and a drive circuit. Such a feature makes it possible to form the foldable display 1 thinner and to keep the power supply and the drive circuit from bending. As a result, the foldable display 1 can improve its reliability. Note that the impact absorbing layer 2 may be fastened to each of the first support substrate 5 and the second support substrate 6 using, for example, either an adhesive layer, or a fastening mechanism such as a screw. Moreover, the impact absorbing layer 2 may be fastened only to outer edges of the first support substrate 5 and the second support substrate 6, using, for example, an adhesive layer or tape.

The folding mechanism 7 is, for example, a hinge that can be fixed in a folding state. The folding mechanism 7 may be made of any given material as long as the folding mechanism 7 connects to the first support substrate 5 and the second support substrate 6 and overlaps with the third region R3 in plan view. For example, the folding mechanism 7 may be made of a metal material provided with a plurality of holes.

FIG. 2(a) is a plan view showing the flexible display panel 4 included in the foldable display 1 of the first embodiment, and FIG. 2(b) is a plan view showing a flexible display panel 4a that can be included in the foldable display 1 of the first embodiment.

As illustrated in FIG. 2(a), the flexible display panel 4 includes: the first region R1 supported by the first support substrate 5; the second region R2 supported by the second support substrate 6; and the third region R3 positioned between the first region R1 and the second region R2.

This embodiment exemplifies a case where, as illustrated in FIG. 2(a), the flexible display panel 4 included in the foldable display 1 is provided with: the slit SL1 in a metal film in a first position at a shortest distance LB, from the third region R3, shorter than a shortest distance LA from an end portion of the first region R1 across from the third region R3; and the slit SL2 in a metal film in a second position at a shortest distance LD, from the third region R3, shorter than a shortest distance LC from an end portion of the second region R2 across from the third region R3. However, this embodiment shall not be limited to such a case. For example, only either the metal film in the first position or the metal film in the second position may be provided with a slit.

Moreover, this embodiment exemplifies a case where each of the first region R1 and the second region R2 in the flexible display panel 4 is provided with one slit. However, this embodiment shall not be limited to such a case. Each of the first region R1 and the second region R2 in the flexible display panel 4 may be provided with a plurality of slits.

Note that if each of the first region R1 and the second region R2 in the flexible display panel 4 is provided with a plurality of slits, at least one of the plurality of slits of the first region R1 may be provided in the first position, and at least one of the plurality of slits of second region R2 may be provided in the second position.

This embodiment exemplifies a case where, as illustrated in FIG. 2(a), the slit SL1 and the slit SL2 are formed linearly along the bending center GC, of the third region R3, extending linearly. However, this embodiment shall not be limited to such a case. As long as the slit SL1 and the slit SL2 are provided in the first position and the second position, the slits may be formed in, for example, diagonal lines not in parallel with the bending center GC of the third region R3, or even in curving lines.

Note that, as illustrated in FIG. 2(a), if, in the flexible display panel 4, the metal film in the first region R1 is provided with the slit SL1 and the metal film in the second region R2 is provided with the slit SL2, the slit SL1 divides the metal film in the first region R1 into two and the slit SL2 divides the metal film in the first region R2 into two.

The foldable display 1 of the first embodiment may include the flexible display panel 4a illustrated in FIG. 2(b), instead of the flexible display panel 4 illustrated in FIG. 2(a). As to the flexible display panel 4a illustrated in FIG. 2(b), a slit SL1' and a slit SL2' are different in shape from the slit SL1 and the slit SL2 of the flexible display panel 4 illustrated in FIG. 2(a).

As to the flexible display panel 4a illustrated in FIG. 2(b), the slit SL1' includes a plurality of subslits SSL1, and the plurality of subslits SSL1 are spaced apart from each other at a distance S. The distance S between the plurality of subslits SSL1 is a connecting portion, and is preferably 100 µm or less. Likewise, the slit SL2' includes a plurality of subslits SSL2, and the plurality of subslits SSL2 are spaced apart from each other at the distance S. The distance S between the plurality of subslits SSL2 is a metal connecting portion, and is preferably 100 µm or less. As can be seen, the slit SL1' and the slit SL2' illustrated in FIG. 2(b) include the metal connecting portions. Thanks to the metal connecting portions, films can be attached together in a size of the foldable display 1; that is, a diced size. Such a feature can facilitate alignment adjustments, reduce faulty alignments, and improve yields. The metal connecting portions will be described in detail later. Note that if the slit SL1' and the slit SL2' illustrated in FIG. 2(b) are bent (e.g., 100 times or less) during, for example, an inspection before shipping of the foldable display 1, the metal connecting portions could be broken. Even if the metal connecting portions are broken, the break rarely affects the foldable display 1. The break does not affect display quality of the foldable display 1. Hence, all the slit SL1 and the slit SL2 of the flexible display panel 4 illustrated in FIG. 2(a) and the slit SL1' and the slit SL2' of the display panel 4a illustrated in FIG. 2(b) can serve a function of slits.

Figure 2:
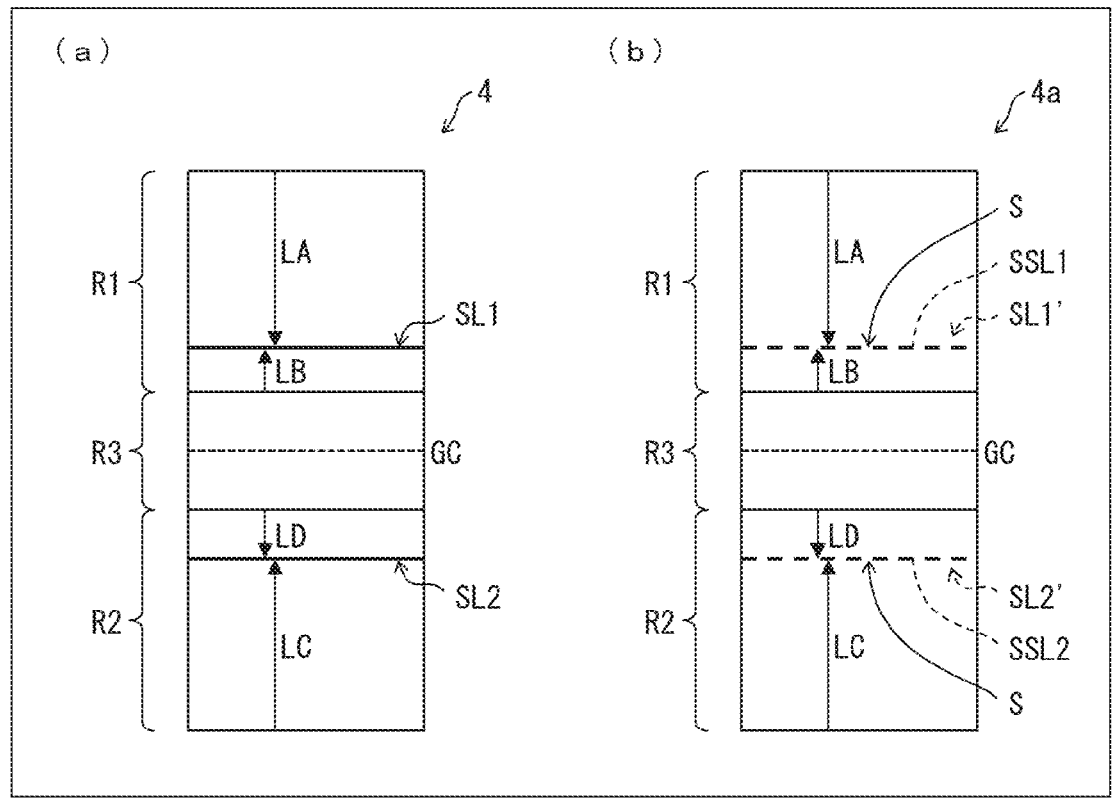
FIG. 2(a) is a plan view showing a flexible display panel included in the foldable display of the first embodiment.
FIG. 2(b) is a plan view showing a modification of the flexible display panel that can be included in the foldable display of the first embodiment.

The slit SL1 and the slit SL2 illustrated in FIG. 2(a) and the slit SL1' and the slit SL2' illustrated in FIG. 2(b) have a width perpendicular to the bending center GC, of the third region R3, extending linearly (i.e., the vertical width in FIG. 2, and a slit width SL1W and a slit width SL2W in FIG. 1). The width is preferably 500 µm or less, and more preferably, 200 µm or less.

Figure 3:
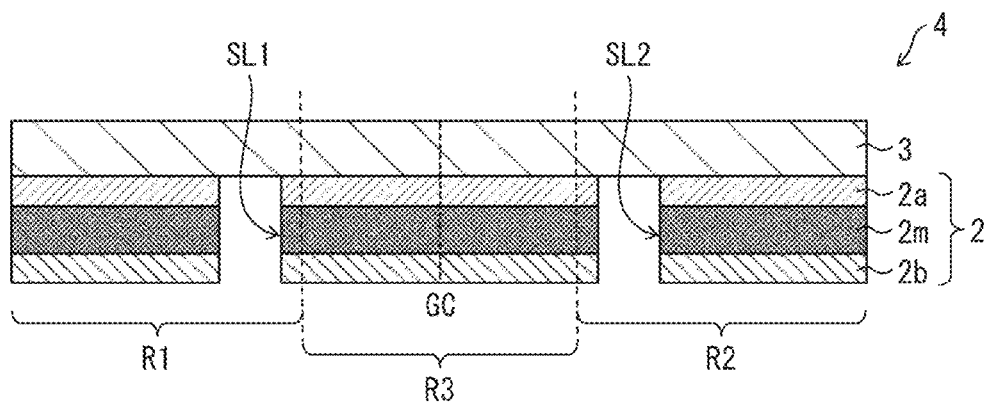
FIG. 3 is a cross-sectional view showing a schematic configuration of the flexible display panel included in the foldable display of the first embodiment.

FIG. 3 is a cross-sectional view showing a schematic configuration of the flexible display panel 4 included in the foldable display 1 of the first embodiment.

Figure 4:
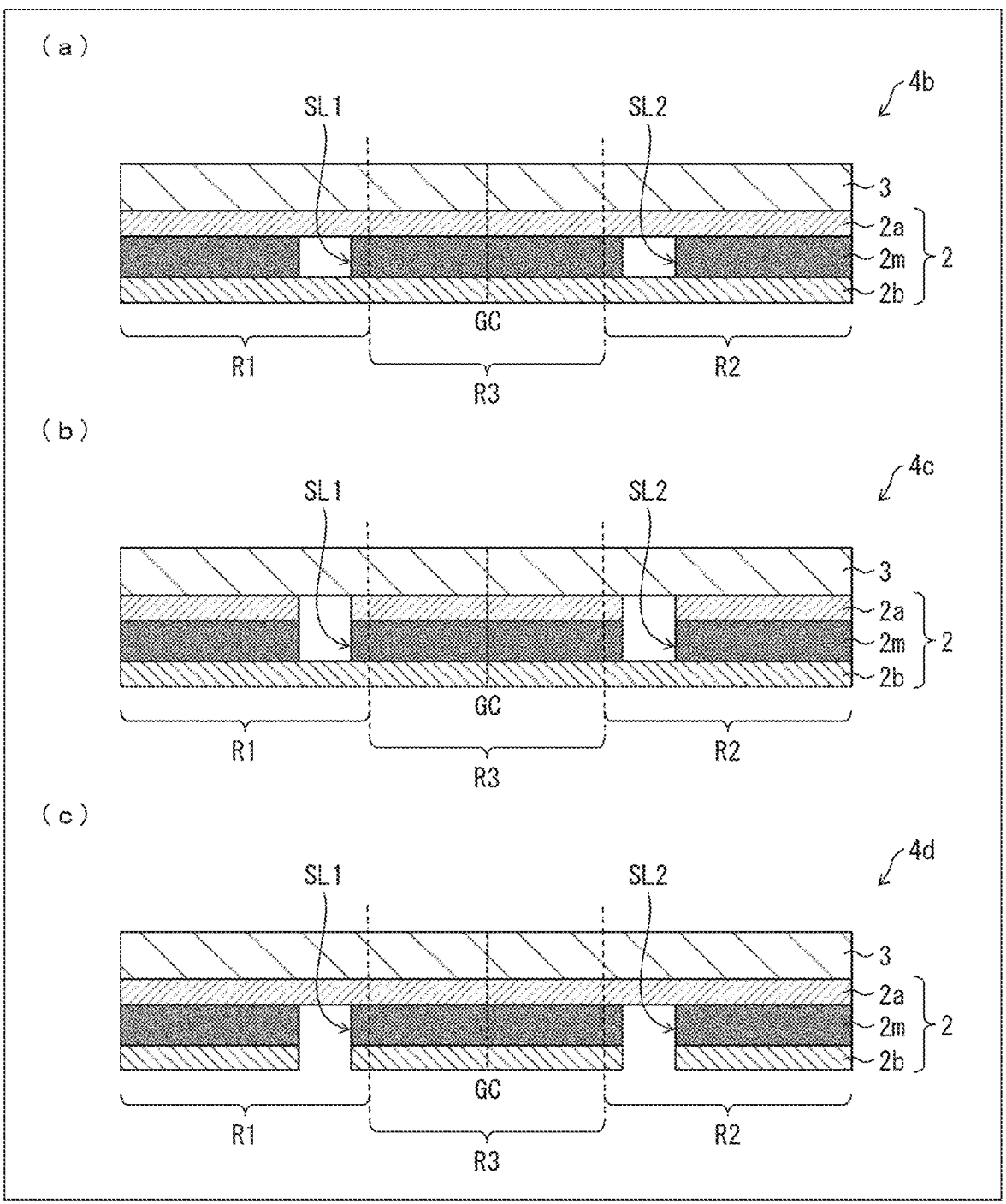

FIG. 4(a), FIG. 4 (b), and FIG. 4(c) are cross-sectional views showing schematic configurations of modifications of flexible display panels that can be included in the foldable display 1 of the first embodiment.

As illustrated in FIG. 3, the flexible display panel 4 includes: the impact absorbing layer 2 including a metal film 2m; and the display layer 3 provided on a surface of the impact absorbing layer 2. This embodiment exemplifies a case where the impact absorbing layer 2 further includes: a first adhesive layer 2a provided to a surface of the metal film 2m; and a second adhesive layer 2b provided to another surface of the metal film 2m, and the slit SL1 and the slit SL2 are provided to the first adhesive layer 2a, the second adhesive layer 2b, and the metal film 2m. However, this embodiment shall not be limited to such a case. As illustrated in FIG. 4(a), a flexible display panel 4b includes: the impact absorbing layer 2 including the metal film 2m; and the display layer 3 provided on a surface of the impact absorbing layer 2. The impact absorbing layer 2 may further include: the first adhesive layer 2a provided to a surface of the metal film 2m; and the second adhesive layer 2b provided to another surface of the metal film 2m, and the slit SL1 and the slit SL2 may be provided only to the metal film 2m. Moreover, as illustrated in FIG. 4(b), a flexible display panel 4c includes: the impact absorbing layer 2 including the metal film 2m; and the display layer 3 provided on a surface of the impact absorbing layer 2. The impact absorbing layer 2 may further include: the first adhesive layer 2a provided to a surface of the metal film 2m; and the second adhesive layer 2b provided to another surface of the metal film 2m, and the slit SL1 and the slit SL2 may be provided to the metal film 2m and the first adhesive layer 2a. Moreover, as illustrated in FIG. 4(c), a flexible display panel 4d includes: the impact absorbing layer 2 including the metal film 2m; and the display layer 3 provided on a surface of the impact absorbing layer 2. The impact absorbing layer 2 may further include: the first adhesive layer 2a provided to a surface of the metal film 2m; and the second adhesive layer 2b provided to another surface of the metal film 2m, and the slit SL1 and the slit SL2 may be provided to the metal film 2m and the second adhesive layer 2b. As described above, the slits may be provided only to the metal film 2m, or to at least one of the first adhesive layer 2a or the second adhesive layer 2b and the metal film 2m. Note that the first adhesive layer 2a and the second adhesive layer 2b are preferably optically clear adhesives (OCAs).

Note that the metal film 2m contains preferably at least one of stainless steel, aluminum, titanium, or copper.

Moreover, the metal film 2m has a thickness of preferably 10 μm or more and 100 μm or less, and, more preferably, 20 μm or more and 50 μm or less.

A method for manufacturing the foldable display 1 illustrated in FIG. 1 includes: a step of forming the flexible display panels 4 and 4a to 4d including the display layer 3 provided on a surface of the impact absorbing layer 2 including the metal film 2m (see FIG. 3); and a fastening step of fastening the first region R1 of the flexible display panels 4 and 4a to 4d to the first support substrate 5, which is inflexible, from toward the impact absorbing layer 2 and the second region R2 of the flexible display panels 4 and 4a to 4d to the second support substrate 6, which is inflexible, from toward the impact absorbing layer 2, and of overlapping the third region R3 of the display panel 4 and 4a to 4d with the folding mechanism 7 in plan view, the third region R3 being positioned between the first region R1 and the second region R2, and the folding mechanism 7 being connected to the first support substrate 5 and the second support substrate 6. As illustrated in FIG. 2(a) and FIG. 2(b), the step of forming the flexible display panels 4 and 4a to 4d further includes a step of providing the slits SL1, SL2, SL1' and SL2' to the metal film 2m at least in the first position or the second position, the first position being at the shortest distance LB, from the third region R3, shorter than the shortest distance LA from an end portion of the first region R1 across from the third region R3, and the second position being at the shortest distance LD, from the third region R3, shorter than the shortest distance LD from an end portion of the second region R2 across from the third region R3.

Note that, at the step of fastening, the impact absorbing layer 2 may be fastened to each of the first support substrate 5 and the second support substrate 6 using, for example, either an adhesive layer, or a fastening mechanism such as a screw. Moreover, the impact absorbing layer 2 may be fastened only to outer edges of the first support substrate 5 and the second support substrate 6, using, for example, an adhesive layer or tape.

Figure 5:
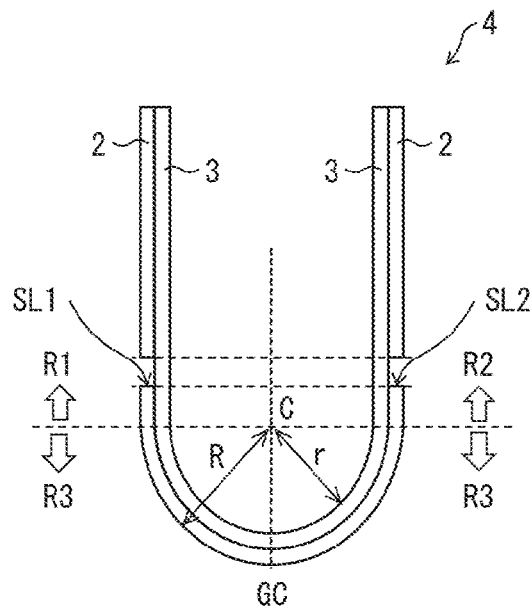
FIG. 5 is a view showing the foldable display of the first embodiment folded in a U-shape.

FIG. 5 is a view showing the foldable display 1 of the first embodiment folded in a U-shape.

Note that FIG. 5 illustrates the flexible display panel 4 alone included in the foldable display 1 of the first embodiment.

The first region R1 of the flexible display panel 4 is supported by the first support substrate 5 that is a not-shown inflexible substrate. Hence, the first region R1 is in a non-bent state. The second region R2 of the flexible display panel 4 is supported by the second support substrate 6 that is a not-shown inflexible substrate. Hence, the second region R2 is in a non-bent state. The third region R3 of the flexible display panel 4 is in a first bent state in which a bending radius r of the display layer 3 is smaller than a bending radius R of the impact absorbing layer 2. The flexible display panel 4 is folded in a U-shape.

Note that, as illustrated in FIG. 5, a bending center point C is found on a plane (on a plane in FIG. 5) formed in a direction perpendicular to the bending center GC, of the third region R3, extending linearly as illustrated in FIG. 2(a). The bending radius r of the display layer 3 is a length from the bending center point C to the display layer 3 on the plane. The bending radius R of the impact absorbing layer 2 is a length, on the plane, from the bending center point C on the plane to a surface across from another surface, of the impact absorbing layer 2, in contact with the display layer 3. That is, the bending radius r of the display layer 3 is a length not including a thickness of the display layer 3, and the bending radius R of the impact absorbing layer 2 is a length including a thickness of the impact absorbing layer 2.

Figure 6:
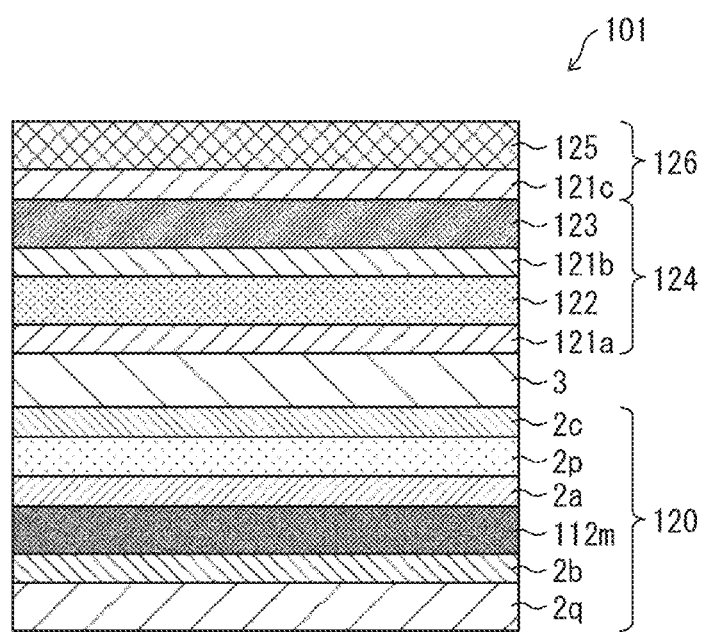
FIG. 6 is a view showing a schematic configuration of a sample panel without a slit.
Figure 7:
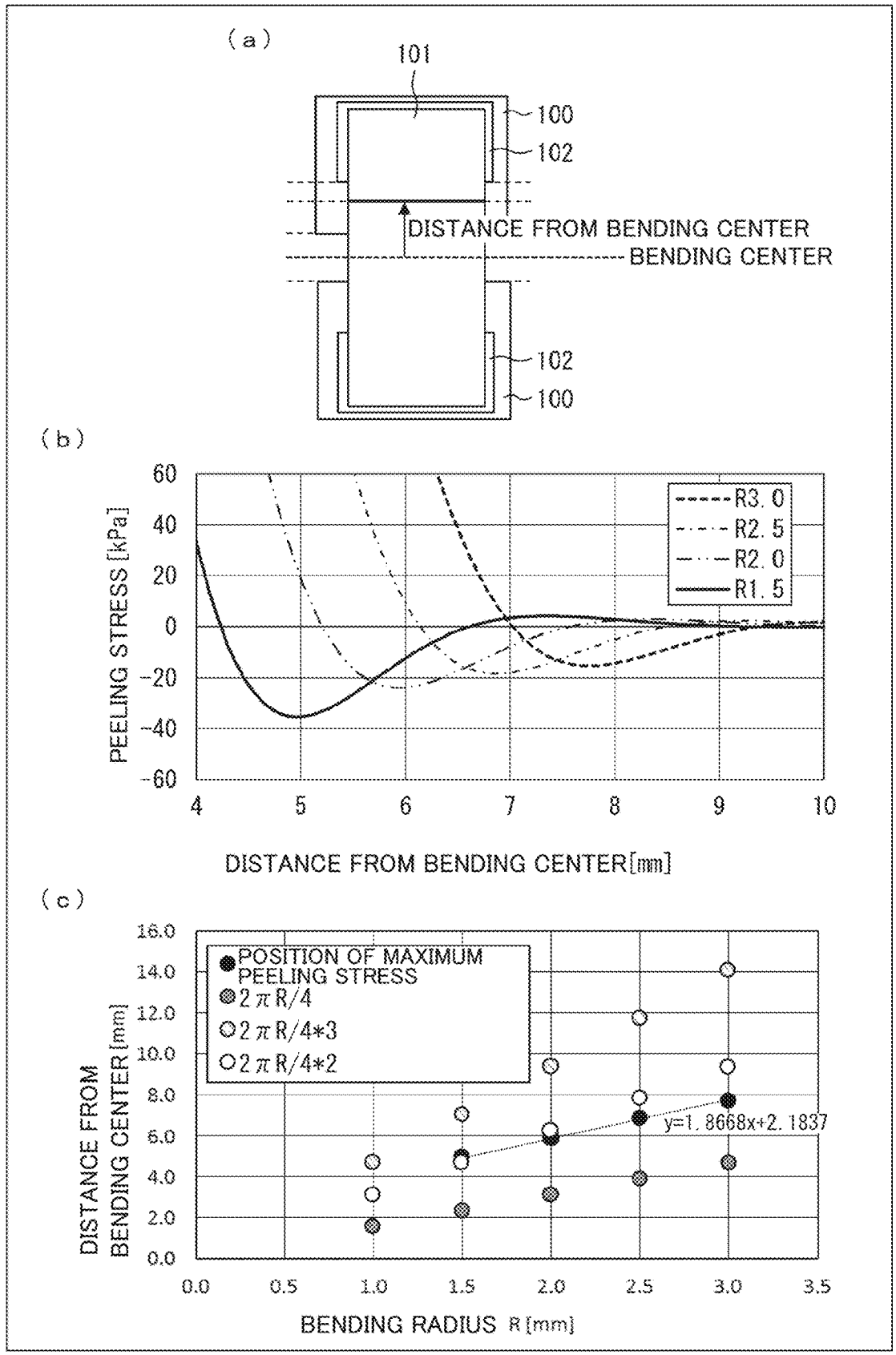
FIG. 7(a), FIG. 7(b), and FIG. 7(c) are views showing where a slit is preferably provided when the foldable display of the first embodiment is folded in a U-shape.
Figure 8:
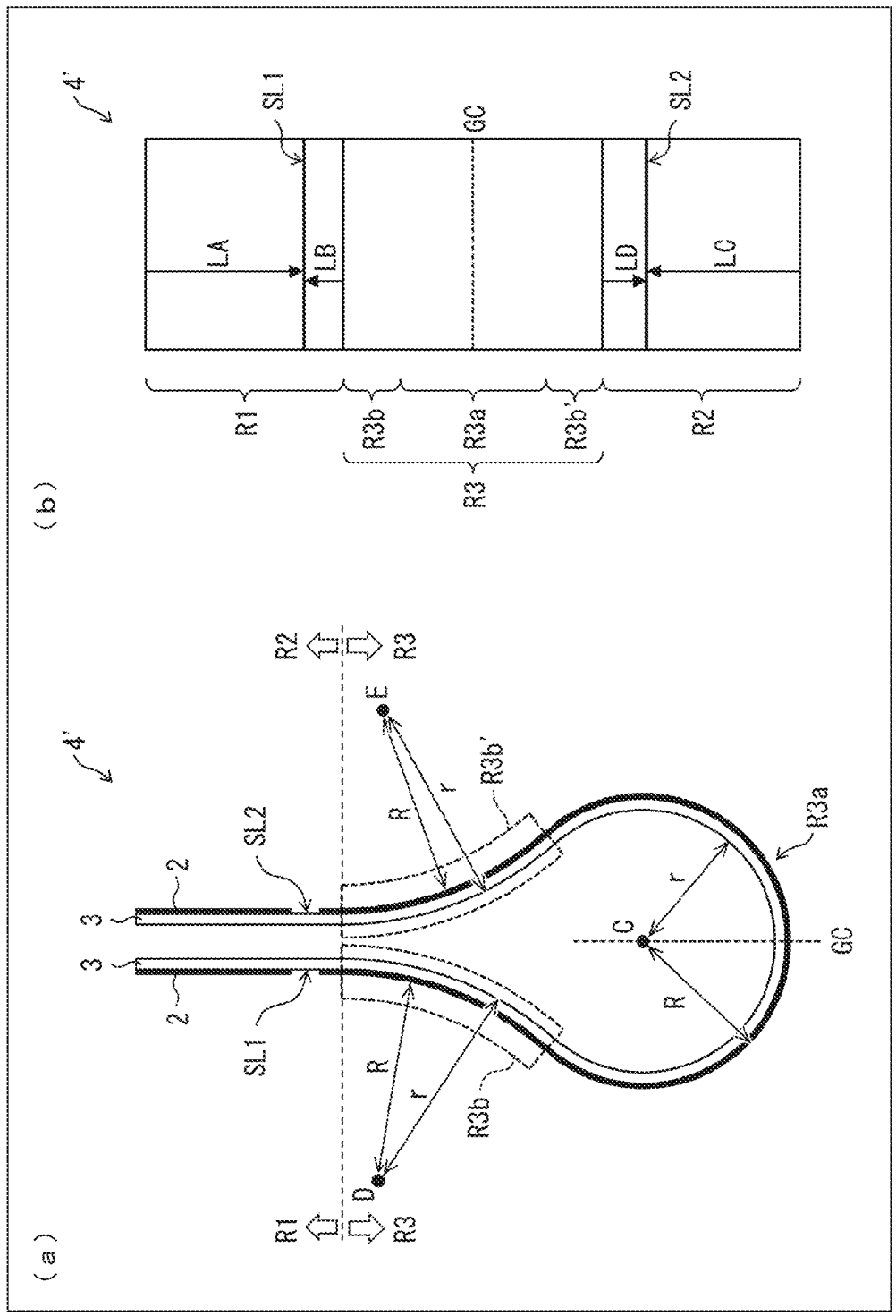
FIG. 8(a) is a view showing a modification of the foldable display of the first embodiment folded in a droplet shape.
FIG. 8(b) is a plan view showing the modification of the foldable display of the first embodiment in FIG. 8(a).
Figure 9:
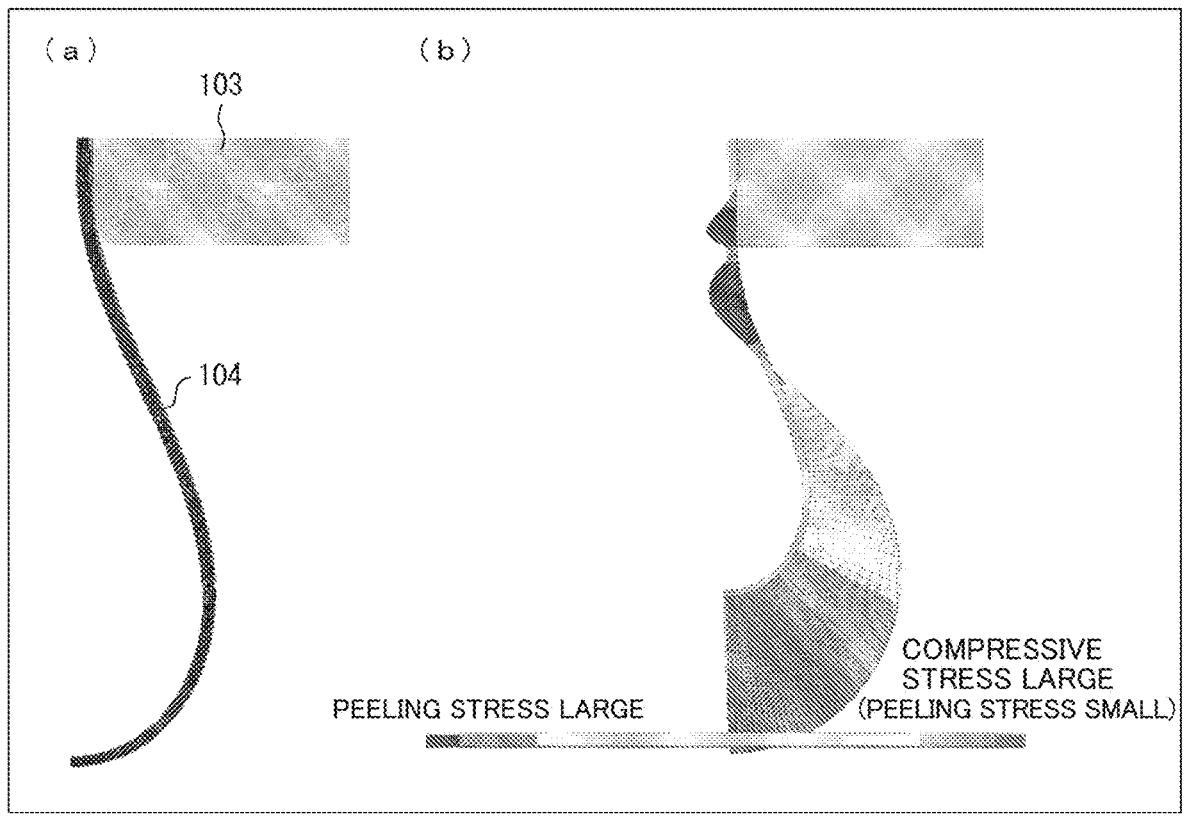
FIG. 9(a) and FIG. 9(b) are views showing where a slit is preferably provided when the modification of the foldable display of the first embodiment is folded in a droplet shape.

FIG. 6 is a view showing a schematic configuration of a sample panel 101 without a slit.

The sample panel 101 illustrated in FIG. 6 is a multilayer stack including: an impact absorbing layer 120; the display layer 3; a functional layer 124; and a cover layer 126, all of which are stacked on top of another in the stated order from toward the impact absorbing layer 120. The impact absorbing layer 120 includes: a second polymer film 2q; the second adhesive layer 2b; a metal film 112m without a slit; the first adhesive layer 2a; a first polymer film 2p; and a third adhesive layer 2c provided between the first polymer film 2p and the display layer 3, all of which are stacked on top of another in the stated order from toward the second polymer film 2q. The functional layer 124 includes: a fourth adhesive layer 121a provided between the display layer 3 and a touch panel 122; the touch panel 122; a fifth adhesive layer 121b; and a polarizing plate 123, all of which are stacked on top of another in the stated order from toward the fourth adhesive layer 121a. The cover layer 126 includes: a sixth adhesive layer 121c provided between the polarizing plate 123 and a window film 125; and the window film 125, both of which are stacked on top of another in the stated order from toward the sixth adhesive layer 121c. Note that, in the sample panel 101, the third adhesive layer 2c, the fourth adhesive layer 121a, the fifth adhesive layer 121b, and the sixth adhesive layer 121c are optically clear adhesives (OCAs).

FIG. 7(a), FIG. 7(b), and FIG. 7(c) are views showing where a slit is preferably provided when the foldable display 1 of the first embodiment is folded in a U-shape.

FIG. 7(a) shows a case where a simulation is run of the sample panel 101 without a slit in FIG. 6. The sample panel 101 is fastened to a bending jig 100, including two inflexible support substrates, with a fastening member 102 such as a tape.

Using the bending jig 100, the sample panel 101 is folded in a U-shape as illustrated in FIG. 5 so that the impact absorbing layer 120 has bending radii R of 1.5 mm, 2.0 mm, 2.5 mm, and 3.0 mm. For each of the radii R, a simulation result is obtained. The impact absorbing layer 120 includes: the second polymer film 2q; the second adhesive layer 2b; the metal film 112m without a slit; the first adhesive layer 2a; the first polymer film 2p; and the third adhesive layer 2c.

FIG. 7(b) shows the simulation results showing positions, represented by a distance from a bending center, where a maximum peeling stress is observed. The simulation results are obtained when the sample panel 101 is folded in a U-shape illustrated in FIG. 5 so that the sample panel 101 has the bending radii R of 1.5 mm, 2.0 mm, 2.5 mm, and 3.0 mm Note that peeling stress is a force per unit area to delaminate various films included in the sample panel 101.

As illustrated in FIG. 7(b), if the bending radius R is 1.5 mm, the maxim peeling stress is observed in a position 5 mm away from the bending center. If the bending radius R is 2.0 mm, the maximum peeling stress is observed in a position 5.9 mm away from the bending center. If the bending radius R is 2.5 mm, the maximum peeling stress is observed in a position 6.9 mm away from the bending center. If the bending radius R is 3.0 mm, the maximum peeling stress is observed in a position 7.8 mm away from the bending center.

FIG. 7(c) is a graph showing positions of maximum peeling stress and preferable positions in which a slit is provided.

FIG. 7(c) shows that, when the sample panel 101 is folded in a U-shape to have the bending radius R of 1.0 mm or more, the position of maximum peeling stress is in a distance, from the bending center, ranging from $2\pi R/4$ to $2\pi R/4 \times 3$. Hence, if the foldable display 1 is folded in a U-shape so that the impact absorbing layer 2 in the third region R3 of the flexible display panel 4 illustrated in FIG. 5 has the bending radius R of 1.0 mm or more, the slits SL1 and SL2 are preferably provided at the shortest distance from the bending center GC, of the third region R3, extending linearly. The shortest distance preferably ranges from $\pi \times R \times 0.5$ to $\pi \times R \times 1.5$.

Moreover, FIG. 7(c) shows that, when the sample panel 101 is folded in a U-shape to have the bending radius R of 2.0 mm or more, the position of maximum peeling stress is in a distance, from the bending center, ranging from $2\pi R/4$ to $2\pi R/4 \times 2$. Hence, if the foldable display 1 is folded in a U-shape so that the impact absorbing layer 2 in the third region R3 of the flexible display panel 4 illustrated in FIG. 5 has the bending radius R of 2.0 mm or more, the slits SL1 and SL2 are preferably provided at the shortest distance from the bending center GC, of the third region R3, extending linearly. The shortest distance preferably ranges from $\pi \times R \times 0.5$ to $\pi \times R$.

FIG. 8(a) is a view showing a modification of the foldable display of the first embodiment folded in a droplet shape. FIG. 8(b) is a plan view showing the modification of the foldable display of the first embodiment in FIG. 8(a).

Note that FIG. 8(a) and FIG. 8(b) illustrate a flexible display panel 4' alone included in a modification of the foldable display 1 of the first embodiment.

FIG. 8(a) and FIG. 8(b) show that, in the case of the flexible display panel 4', a length (a length in a vertical direction in FIG. 8(b)), of the third region R3, in a direction perpendicular to the bending center GC, of the third region R3, extending linearly includes: a region R3a (a portion of the third region in the first bending state) from the bending center GC, of the third region R3, extending linearly; and remaining regions R3b and R3b' (portions of the third region in the second bending state). Hence, the length of the third region R3 is set relatively long.

As illustrated in FIG. 8(a) and FIG. 8(b), the first region R1 of the flexible display panel 4' is supported by the first support substrate 5 that is a not-shown inflexible substrate. Hence, the first region R1 is in a non-bent state. The second region R2 of the flexible display panel 4 is supported by the second support substrate 6 that is a not-shown inflexible substrate. Hence, the second region R2 is in a non-bent state. In the third region R3 of the flexible display panel 4', the region R3a from the bending center GC, of the third region R3, extending linearly, is in the first bending state in which the bending radius r of the display layer 3 is smaller than the bending radius R of the impact absorbing layer 2, and the remaining regions R3b and R3b' are in the second bending state in which the bending radius r of the display layer 3 is larger the bending radius R of the impact absorbing layer 2. The flexible display panel 4' is folded in a droplet shape.

The bending center point C is found on a plane (on a plane in FIG. 5) formed in a direction perpendicular to the bending center GC, of the third region R3, extending linearly as illustrated in FIG. 8(b). In the region R3a from the bending center GC, of the third region R3, extending linearly, the bending radius r of the display layer 3 is a length from the bending center point C to the display layer 3 on the plane. The bending radius R of the impact absorbing layer 2 is a length, on the plane, from the bending center point C on the plane to a surface across from another surface, of the impact absorbing layer 2, in contact with the display layer 3. That is, the bending radius r of the display layer 3 is a length not including a thickness of the display layer 3, and the bending radius R of the impact absorbing layer 2 is a length including a thickness of the impact absorbing layer 2.

A bending center point D is found on a plane (on a plane in FIG. 8(a)) formed in a direction perpendicular to the bending center GC, of the third region R3, extending linearly as illustrated in FIG. 8(b). In the remaining region R3b, the bending radius r of the display layer 3 is a length, on the plane, from the bending center point D to a surface across from another surface, of the display layer 3, in contact with the impact absorbing layer 2. The bending radius R of the impact absorbing layer 2 is a length, on the plane, from the bending center point D found on the plane to the impact absorbing layer 2. A bending center point E is found on a plane (on a plane in FIG. 8(a)) formed in a direction perpendicular to the bending center GC, of the third region R3, extending linearly as illustrated in FIG. 8(b). As to the remaining region R3b', the bending radius r of the display layer 3 is a length, on the plane, from the bending center point E to a surface across from another surface, of the display layer 3, in contact with the impact absorbing layer 2. The bending radius R of the impact absorbing layer 2 is a length, on the plane, from the bending center point E found on the plane to the impact absorbing layer 2. That is, as to the remaining regions R3b and R3b', the bending radius r of the display layer 3 is a length including a thickness of the display layer 3, and the bending radius R of the impact absorbing layer 2 is a length not including a thickness of the impact absorbing layer 2.

FIG. 9(a) and FIG. 9(b) are views showing a preferable position where a slit is provided when the modification of the foldable display 1 of the first embodiment is folded in a droplet shape.

Figure 10:
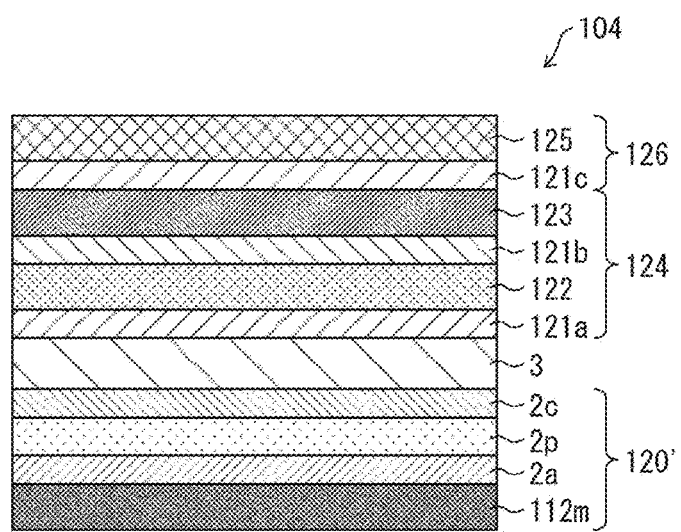
FIG. 10 is a view showing a schematic configuration of another sample panel without a slit.

FIG. 10 is a view showing a schematic configuration of another sample panel 104 without a slit.

The sample panel 104 illustrated in FIG. 10 is a multilayer stack including: an impact absorbing layer 120'; the display layer 3; the functional layer 124; and the cover layer 126, all of which are stacked on top of another in the stated order from toward the impact absorbing layer 120'. The impact absorbing layer 120' includes: the metal film 112m without a slit; the first adhesive layer 2a; the first polymer film 2p; and the third adhesive layer 2c provided between the first polymer film 2p and the display layer 3, all of which are stacked on top of another in the stated order from toward the metal film 112m. The functional layer 124 includes: the fourth adhesive layer 121a provided between the display layer 3 and the touch panel 122; the touch panel 122; the fifth adhesive layer 121b; and the polarizing plate 123, all of which are stacked on top of another in the stated order from toward the fourth adhesive layer 121a. The cover layer 126 includes: the sixth adhesive layer 121c provided between the polarizing plate 123 and the window film 125; and the window film 125, both of which are stacked on top of another in the stated order from toward the sixth adhesive layer 121c. Note that, in the sample panel 104, the third adhesive layer 2c, the fourth adhesive layer 121a, the fifth adhesive layer 121b, and the sixth adhesive layer 121c are optically clear adhesives (OCAs).

FIG. 9(a) shows a case where a simulation is run of the sample panel 104 without a slit. The sample panel 104 is fastened to a fastening jig 103 including two inflexible support substrates.

Using the fastening jig 103, the sample panel 104 is folded in a droplet shape illustrated in FIG. 8(a), and a result of the simulation is obtained.

FIG. 9(b) shows positions in which peeling stress and compressive stress are observed in the sample panel 104. FIG. 9(b) shows that the peeling stress increases in a flat region (a non-bending region) fastened by the fastening jig 103, and, in particular, a region near a bending region included in the flat region fastened by the fastening jig 103. Hence, a problem is that various films included in the sample panel 104 might be delaminated in the flat region (the non-bending region) fastened by the fastening jig 103, and, in particular, the region near the bending region included in the flat region (the non-bending region) fastened by the fastening jig 103. Hence, a slit is provided preferably to the flat region (the non-bending region), of the sample panel 104, fastened by the fastening jig 103, and, more preferably, to the region near the bending region included in the flat region (the non-bending region) fastened by the fastening jig 103.

As can be seen, FIG. 8(a) and FIG. 8(b) show that the slit SL1 and the slit SL2 in the first region R1 and the second region R2 of the flexible display panel 4' are respectively provided in contact with the region R3b and the region R3b' included in the third region R3 and observed in the second bending state.

If the impact absorbing layer 2 successfully absorbs impact, the impact absorbing layer 2 has to include the metal film 2m. However, the metal film 2m is greater in coefficient of elasticity than any other constituent member, and is smaller in distortion due to the same stress (in bending) than any other constituent member. Hence, the any other constituent member receives stress of large deformation (distortion) from the metal film 2m. Hence, if the metal film 2m is provided, buckling is likely to occur.

As to the flexible display panels 4, 4', and 4a to 4d included in the foldable display 1 of this embodiment, and including: the impact absorbing layer 2 containing the metal film 2m; and the display layer 3, when the third region R3 overlapping with the folding mechanism 7 in plan view is bent, peeling stress increases in regions positioned closer to the third region R3 and included in the first region R1 supported by the inflexible first support substrate 5 and in the second region R2 supported by the inflexible second support substrate 6. The slits SL1, SL2, SL1' and SL2' are formed in the metal film 2m in the regions exhibiting large peeling stress. Such a feature can alleviate the peeling stress, and the resulting foldable display 1 is highly resistant to impact and bending.

Second Embodiment

Next, a second embodiment of the disclosure is described below, with reference to FIG. 11. A foldable display 30 of this embodiment is different from the foldable display 1 of the first embodiment in that the former includes a casing 8 including a folding mechanism 8b. The other features are the same as those of the first embodiment. For convenience in description, like reference signs designate identical or corresponding constituent features between the drawings of this embodiment and the first embodiment. These constituent features will not be elaborated upon.

Figure 11:
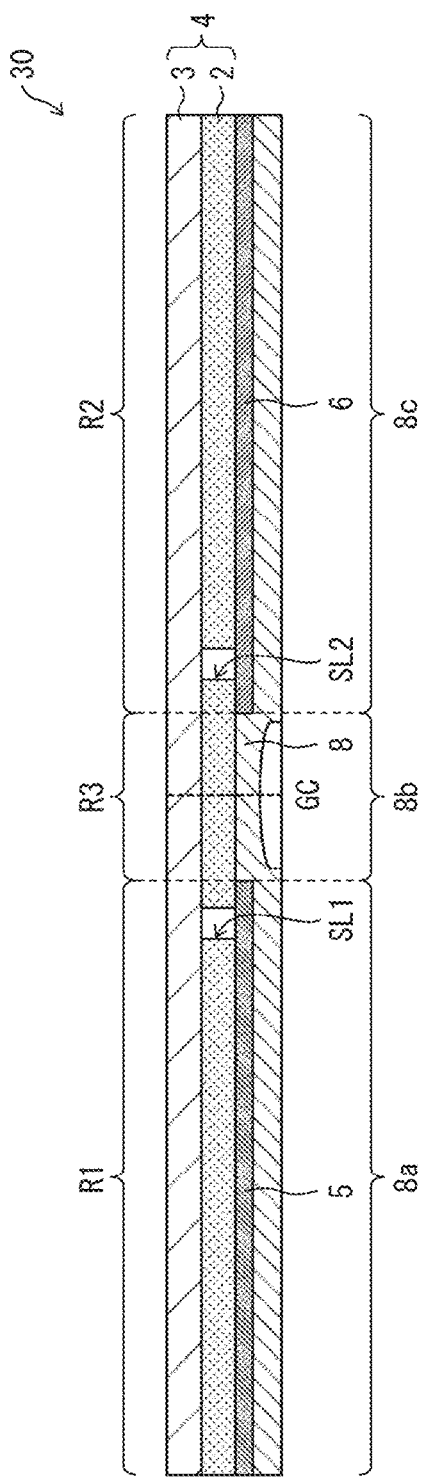
FIG. 11 is a cross-sectional view showing a schematic configuration of a foldable display of a second embodiment.

FIG. 11 is a cross-sectional view showing a schematic configuration of the foldable display 30 of the second embodiment.

The foldable display 30 illustrated in FIG. 11 includes the casing 8 including the folding mechanism 8b. The casing 8 includes: a flat portion 8a connected to the first support substrate 5; a flat portion 8c connected to the second support substrate 6; and the folding mechanism 8b that is foldable. The folding mechanism 8b overlaps with the third region R3 in plan view. The casing 8 may be made of any given material such as, for example, a metal material. If the casing 8 is made of a metal material, the casing 8 may have a plurality of holes only on a portion corresponding to the folding mechanism 8b.

Note that the first support substrate 5 and the flat portion 8a, or the second support substrate 6 and the flat portion 8c, may be fastened together using, for example, either an adhesive layer, or a fastening mechanism such as a screw. Moreover, the flat portion 8a and the flat portion 8c may be fastened only to outer edges of the first support substrate 5 and the second support substrate 6, using, for example, an adhesive layer or tape.

As to the flexible display panel 4 included in the foldable display 30 of this embodiment, and including: the impact absorbing layer 2 containing the metal film 2m; and the display layer 3, when the third region R3 overlapping with the folding mechanism 8b in plan view is bent, peeling stress increases in regions positioned closer to the third region R3 and included in the first region R1 supported by the inflexible first support substrate 5 and in the second region R2 supported by the inflexible second support substrate 6. The slits SL1 and SL2 are formed in the metal film 2m in the regions exhibiting large peeling stress. Such a feature can alleviate the peeing stress, and the resulting foldable display 30 is highly resistant to impact and bending.

Third Embodiment

Next, a third embodiment of the disclosure is described below, with reference to FIGS. 12 and 13. A flexible display panel 4e included in a foldable display of this embodiment includes an impact absorbing layer 2' including: the third adhesive layer 2c; the first polymer film 2p; the first adhesive layer 2a; the metal film 2m; the second adhesive layer 2b; and the second polymer film 2q, and the foldable display of this embodiment is different from the foldable displays 1 and described in the first and second embodiments in that the slit SL1' and the slit SL2' are provided only to the metal film 2m. The other features are the same as those of the first and second embodiments. For convenience in description, like reference signs designate identical or corresponding constituent features between the drawings of this embodiment and the first and second embodiments. These constituent features will not be elaborated upon.

Figure 12:
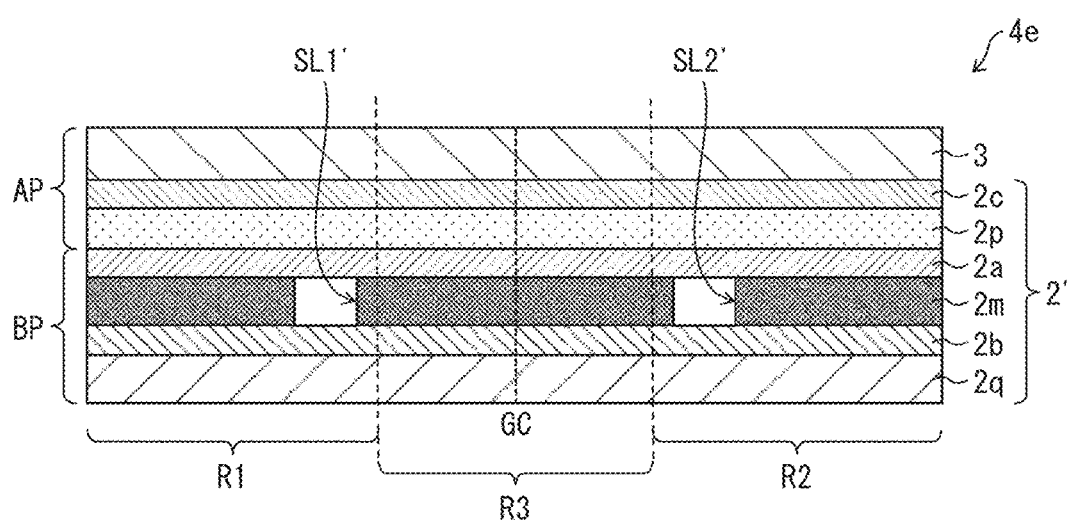
FIG. 12 is a cross-sectional view showing a schematic configuration of a flexible display panel included in a foldable display of a third embodiment.
Figure 13:
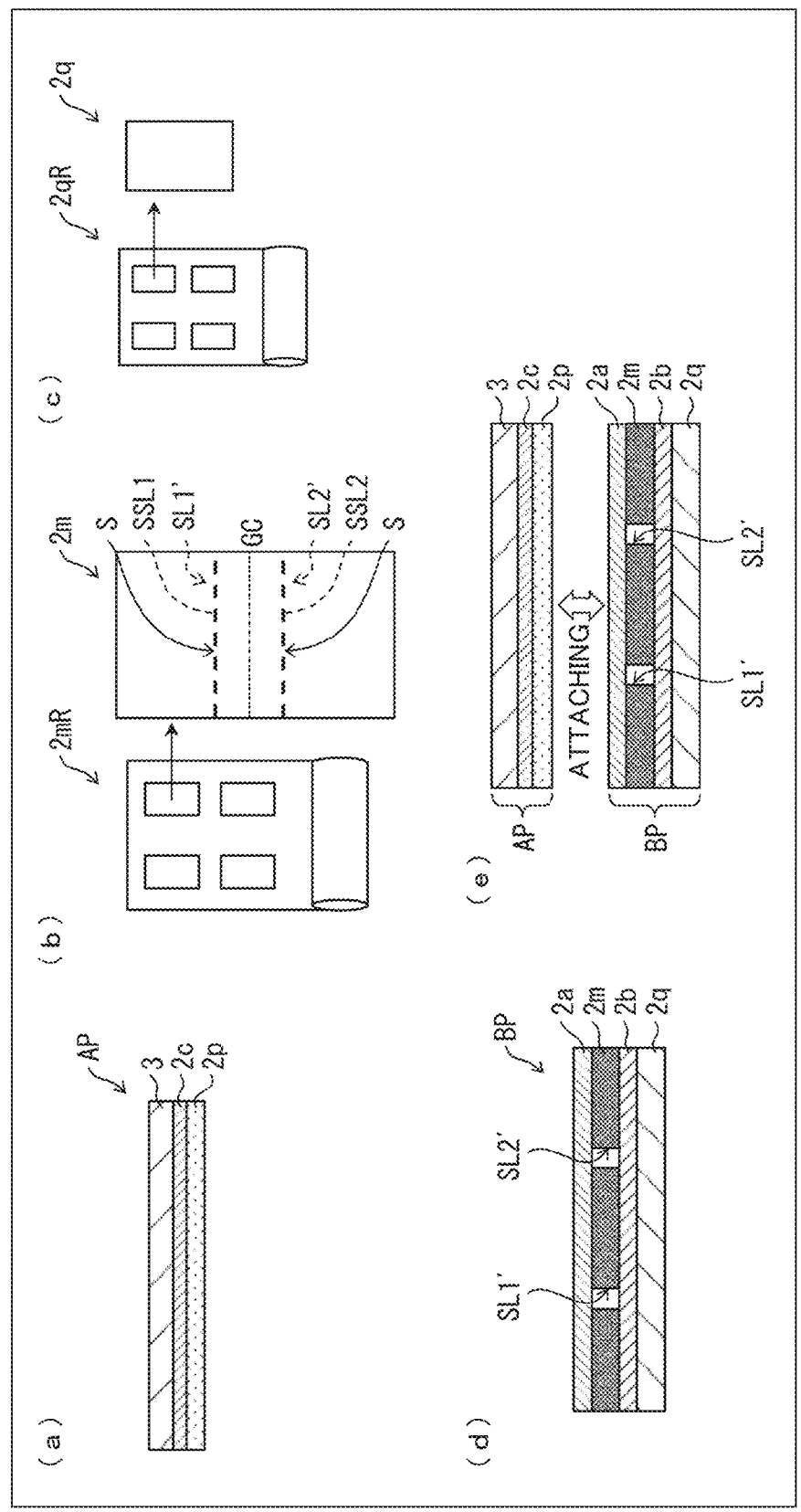
FIG. 13(a), FIG. 13(b), FIG. 13(c), FIG. 13(d), and FIG. 13(e) are views showing an example of a method for manufacturing the foldable display of the third embodiment including the flexible display panel illustrated in FIG. 12.

FIG. 12 is a cross-sectional view showing a schematic configuration of the flexible display panel 4e included in the foldable display of the third embodiment.

As illustrated in FIG. 12, the flexible display panel 4e includes the impact absorbing layer 2' including: the third adhesive layer 2c; the first polymer film 2p; the first adhesive layer 2a; the metal film 2m; the second adhesive layer 2b; and the second polymer film 2q.

Note that the slit SL1' and the slit SL2' formed only in the metal film 2m have the same shapes as those of the slit SL1' and the slit SL2' illustrated in FIG. 2(b).

In order to have the impact absorbing layer 2' absorb a greater impact, one of the first polymer film 2p or the second polymer film 2q preferably contains at least one of polyimide, PET, PEN, COC, or aramid, and another one of the first polymer film 2p or the second polymer film 2q preferably contains at least one of PET, urethane resin, polyester resin, acrylic resin, polycarbonate resin, polyimide, or polyamide. In this embodiment, the first polymer film 2p is formed of, but not limited to, any one of polyimide, PET, PEN, COC, and aramid, and the second polymer film 2q is formed of, but not limited to, any one of PET, urethane resin, polyester resin, acrylic resin, polycarbonate resin, polyimide, and polyamide. For example, the second polymer film 2q, which is disposed farther away from the display layer 3 than the first polymer film 2p is, may be formed of such a foam as acrylic foam or urethane foam.

Moreover, in order to have the impact absorbing layer 2' absorb a greater impact, the first polymer film 2p is preferably different in Young's modulus from the second polymer film 2q.

Furthermore, in order to have the impact absorbing layer 2' absorb a greater impact, at least one of the first polymer film 2p or the second polymer film 2q is preferably thicker than the metal film 2m. That is, the first polymer film 2p may be thicker than the metal film 2m, and the second polymer film 2q may be thinner than the metal film 2m. Moreover, the second polymer film 2q may be thicker than the metal film 2m, and the first polymer film 2p may be thinner than the metal film 2m. Furthermore, the first polymer film 2p and the second polymer film 2q may be thicker than the metal film 2m. In such a case, the first polymer film 2p and the second polymer film 2q may be the same or different in thickness as long as each of the first polymer film 2p and the second polymer film 2q is thicker than the metal film 2m.

FIG. 13(a), FIG. 13(b), FIG. 13(c), FIG. 13(d), and FIG. 13(e) are views showing an example of a method for manufacturing the foldable display of the third embodiment including the flexible display panel 4e illustrated in FIG. 12.

Note that the step of fastening in the method for manufacturing the foldable display has already been described in the first embodiment. Hence, described here is a step of forming the flexible display panel 4e alone.

The step of forming the flexible display panel 4e includes: a step of attaching the first polymer film 2p to a surface of the display layer 3 through the third adhesive layer 2c as illustrated in FIG. 13(a); and a step of forming the slits SL1' and SL2' in regions (regions surrounded by solid lines in the drawing) included in a metal film roll 2mR and each corresponding to the flexible display panel. The slit SL1' includes the plurality of subslits SSL1, and the slit SL2' includes the plurality of subslits SSL2. The plurality of subslits SSL1 are spaced apart from each other at the distance S, and the plurality of subslits SSL2 are spaced apart from each other at the distance S. Note that, at the step of forming the slits SL1' and SL2', the metal film roll 2mR is etched so that the slits SL1' and SL2' can be formed. Moreover, the step of forming the flexible display panel 4e includes: a step of cutting, out of the metal film roll 2mR, the regions each corresponding to the flexible display panel, and obtaining the metal film 2m diced as illustrated in FIG. 13(b); a step of cutting, out of a second polymer film roll 2qR, regions each corresponding to the flexible display panel, and obtaining the second polymer film 2q diced as illustrated in FIG. 13(c); and a step of attaching the diced metal film 2m and the diced second polymer film 2q together through the second adhesive layer 2b as illustrated in FIG. 13(d). Then, finally, the step of forming the flexible display panel 4e includes: a step of forming the first adhesive layer 2a on the diced metal film 2m included in a second member BP including the diced metal film 2m, the second adhesive layer 2b, and the diced second polymer film 2q as illustrated in FIG. 13(d); and a step of attaching the second member BP and a first member AP together through the first adhesive layer 2a as illustrated in FIG. 13(e). The first member AP includes the display layer 3, the third adhesive layer 2c, and the first polymer film 2p.

Note that the second polymer film roll 2qR illustrated in FIG. 13(c) is a roll including at least the second polymer film. For example, the second polymer film roll 2qR may be made only of the second polymer film 2q, or may be made of the second polymer film 2q and the second adhesive layer 2b.

This embodiment exemplifies a case where the first member AP and the second member BP are attached together through the first adhesive layer 2a included in the second member BP and provided to the diced metal film 2m. However, this embodiment shall not be limited to such a case. For example, the first adhesive layer 2a may be provided to the first polymer film 2p of the first member AP. Alternatively, a first adhesive layer 2a may be provided to each of the first polymer film 2p included in the first member AP and the diced metal film 2m included in the second member BP, so that the first member AP and the second member BP may be attached together through the provided first adhesive layers 2a.

Note that this embodiment exemplifies a case where the slits SL1' and SL2' are formed in the metal film roll 2mR, and, after that, regions each corresponding to the flexible display panel are cut out of the metal film roll 2mR, and then, the diced metal film 2m is obtained. However, this embodiment shall not be limited to this case. The regions each corresponding to the flexible display panel may be cut out of the metal film roll 2mR, and then, the diced metal film 2m may be obtained, and after that, the slits SL1' and SL2' may be formed in the diced metal film 2m.

Note that, the slit SL1' and the slit SL2' include the metal connecting portions. Thanks to the metal connecting portions, when the diced metal film 2m and the diced second polymer film 2q, each illustrated in FIG. 13(d), are attached together through the second adhesive layer 2b, the metal film 2m and the second polymer film 2q can be attached together in a size of the foldable display; that is, a divided size. Such a feature can facilitate alignment adjustments, reduce faulty alignments, and improve yields.

As to the flexible display panel 4e included in the foldable display of this embodiment, and including: the impact absorbing layer 2' containing the metal film 2m; and the display layer 3, when the third region R3 overlapping with the folding mechanisms 7 and 8b in plan view is bent, peeling stress increases in regions positioned closer to the third region R3 and included in the first region R1 supported by the inflexible first support substrate 5 and in the second region R2 supported by the inflexible second support substrate 6. The slits SL1' and SL2' are formed in the metal film 2m in the regions exhibiting large peeling stress. Such a feature can alleviate the peeing stress, and the resulting foldable display is highly resistant to impact and bending.

Fourth Embodiment

Figure 15:
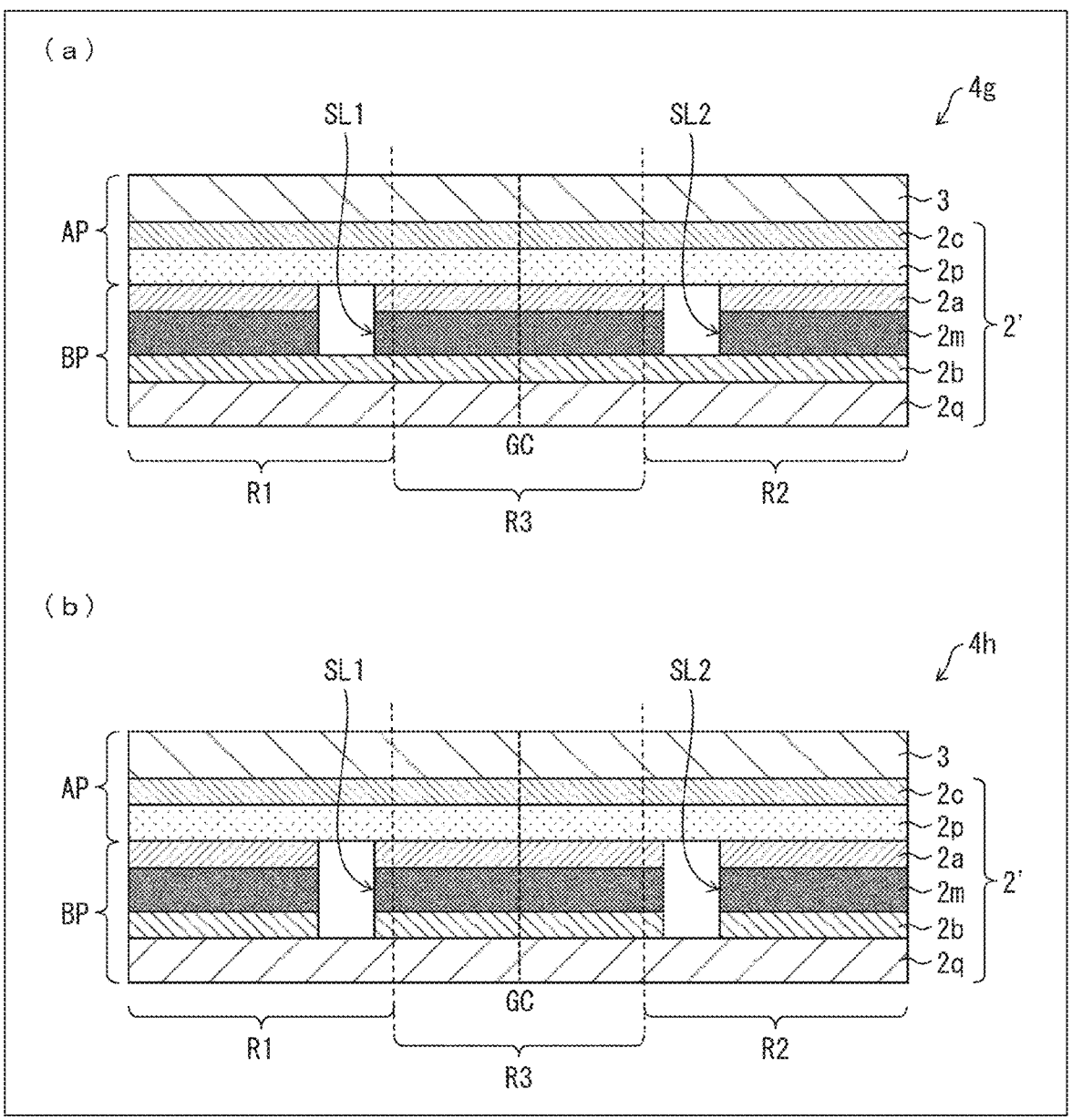
FIG. 15(a) and FIG. 15(b) are cross-sectional views showing schematic configurations of other modifications of flexible display panels that can be included in the foldable display of the fourth embodiment.
Figure 16:
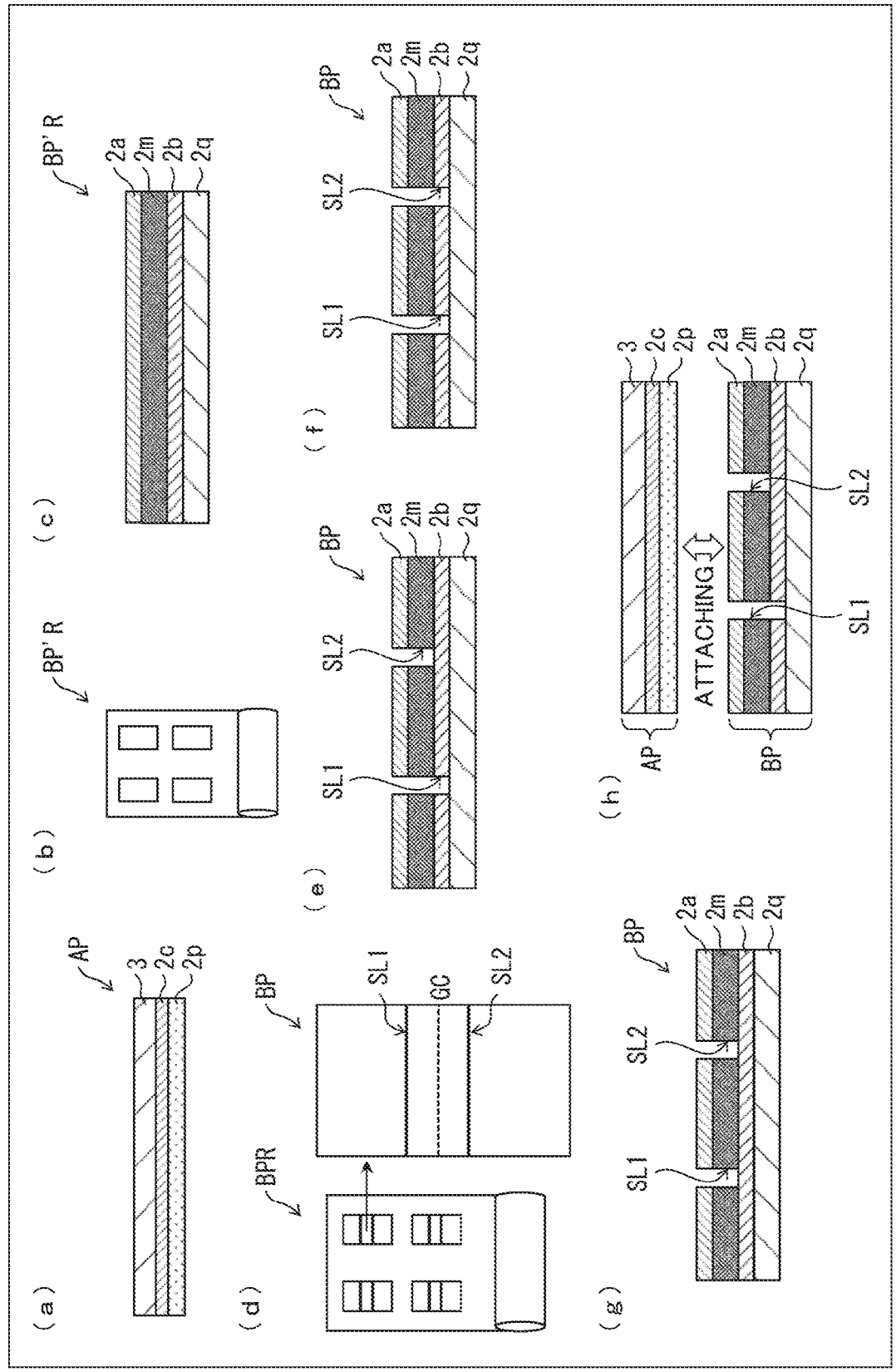
FIG. 16(a), FIG. 16(b), FIG. 16(c), FIG. 16(d), FIG. 16(e), FIG. 16(f), FIG. 16(g), and FIG. 16(h) are views showing an example of a method for manufacturing the foldable display including the flexible display panel illustrated in FIGS. 14. and 15.

Next, a fourth embodiment of the disclosure is described below, with reference to FIGS. 14, 15, and 16. Flexible display panels 4f to 4h included in a foldable display of this embodiment are different from the foldable display described in the third embodiment in that the flexible display panels 4f to 4h each include the impact absorbing layer 2' including: the third adhesive layer 2c; the first polymer film 2p; the first adhesive layer 2a; the metal film 2m; the second adhesive layer 2b; and the second polymer film 2q, and the slit SL1 and the slit SL2 are formed in the metal film 2m and at least one of the first adhesive layer 2a or the second adhesive layer 2b. The other features are the same as those of the first to third embodiments. For convenience in description, like reference signs designate identical or corresponding constituent features between the drawings of this embodiment and the first to third embodiments. These constituent features will not be elaborated upon.

Figure 14:
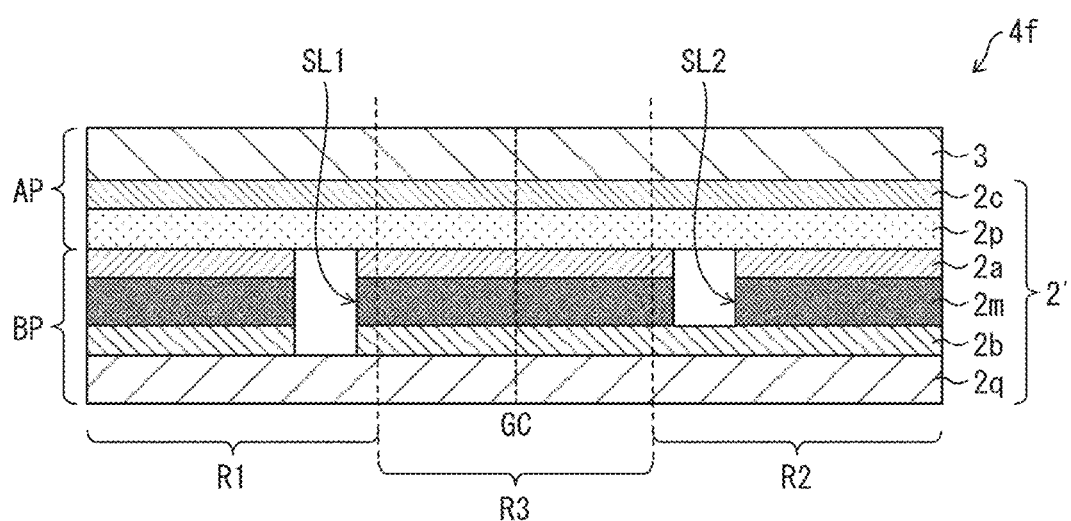
FIG. 14 is a cross-sectional view showing a schematic configuration of a modification of a flexible display panel included in a foldable display of a fourth embodiment.

FIG. 14 is a cross-sectional view showing a schematic configuration of the flexible display panel 4f included in the foldable display of the fourth embodiment.

As illustrated in FIG. 14, the flexible display panel 4f includes the impact absorbing layer 2' including: the third adhesive layer 2c; the first polymer film 2p; the first adhesive layer 2a; the metal film 2m; the second adhesive layer 2b; and the second polymer film 2q. The slit SL1 illustrated in FIG. 14 is formed in the first adhesive layer 2a, the second adhesive layer 2b, and the metal film 2m. The slit SL2 illustrated in FIG. 14 is formed in the first adhesive layer 2a and the metal film 2m.

FIG. 15(a) and FIG. 15(b) are cross-sectional views showing schematic configurations of other modifications of flexible display panels that can be included in the foldable display of the fourth embodiment.

As illustrated in FIG. 15(a), the flexible display panel 4g includes the impact absorbing layer 2' including: the third adhesive layer 2c; the first polymer film 2p; the first adhesive layer 2a; the metal film 2m; the second adhesive layer 2b; and the second polymer film 2q. The slit SL1 and the slit SL2 illustrated in FIG. 15(a) are formed in the first adhesive layer 2a and the metal film 2m.

As illustrated in FIG. 15(b), the flexible display panel 4h includes the impact absorbing layer 2' including: the third adhesive layer 2c; the first polymer film 2p; the first adhesive layer 2a; the metal film 2m; the second adhesive layer 2b; and the second polymer film 2q. The slit SL1 and the slit SL2 illustrated in FIG. 15(b) are formed in the first adhesive layer 2a, the metal film 2m, and the second adhesive layer 2b.

FIG. 16(a), FIG. 16(b), FIG. 16(c), FIG. 16(d), FIG. 16(e), FIG. 16(f), FIG. 16(g), and FIG. 16(h) are views showing an example of a method for manufacturing the foldable display including the flexible display panels 4f to 4h illustrated in FIGS. 14. and 15.

Note that the step of fastening in the method for manufacturing the foldable display has already been described in the first embodiment. Hence, described here is a step of forming the flexible display panels 4f to 4h alone.

The step of forming the flexible display panels 4f to 4h includes: a step of attaching the first polymer film 2p to a surface of the display layer 3 through the third adhesive layer 2c as illustrated in FIG. 16(a); and a step of forming a multilayer stack roll BP'R in which a roll of the second polymer film 2q is attached to a surface of a roll of the metal film 2m through the second adhesive layer 2b, and the first adhesive layer 2a is formed on another surface of the roll of the metal film 2m, as illustrated in FIG. 16(b) and FIG. 16(c). Furthermore, as illustrated in FIG. 16(d), the step of forming the flexible display panels 4f to 4h includes: a step of dividing the metal film 2m into two in at least one of the first region R1 or the second region R2, and forming the slits SL1 and SL2 in the metal film 2m and in at least one of the second adhesive layer 2b or the first adhesive layer 2a, for regions included in the multilayer stack roll BP'R and each corresponding to the flexible display panel; and a step of cutting, out of the multilayer stack roll BP'R in which the slits SL1 and SL2 are formed, the regions each corresponding to the flexible display panel, and obtaining a diced multilayer stack BP. Note that, at the step of forming the slits SL1 and SL2, the slits SL1 and SL2 can be, for example, punched out of the multilayer stack roll BP'R. Moreover, at the step of forming the slits SL1 and SL2, the second polymer film 2q serves as a support substrate. Simultaneously, the diced multilayer stack BP can be obtained. Hence, the step of forming the slits SL1 and SL2 and the step of obtaining the diced multilayer stack BP may be carried out in a single step. FIG. 16(e) illustrates the diced multilayer stack BP including: the slit SL1 formed in the first adhesive layer 2a, the metal film 2m, and the second adhesive layer 2b; and the slit SL2 formed in the first adhesive layer 2a and the metal film 2m. FIG. 16(f) illustrates the diced multilayer stack BP including the slits SL1 and SL2 formed in the first adhesive layer 2a, the metal film 2m, and the second adhesive layer 2b. FIG. 16(g) illustrates the diced multilayer stack BP including the slits SL1 and SL2 formed in the first adhesive layer 2a and the metal film 2m Finally, as illustrated in FIG. 16(h), the step of forming the flexible display panels 4f to 4h includes a step of attaching the first polymer film 2p illustrated in FIG. 16(h) and the diced multilayer stack BP illustrated in FIG. 16(e) together through the first adhesive layer 2a. The first polymer film 2q is included in the first member AP including the display layer 3, the third adhesive layer 2c, and the first polymer film 2p. Note that exemplified here is a case where the diced multilayer stack BP illustrated in FIG. 16(e) is attached to the first member AP. However, the example shall not be limited to such a case. The diced multilayer stack BP illustrated in either FIG. 16(f) or FIG. 16(g) may be attached to the first member AP.

Thanks to the method for manufacturing the foldable display, at the step of attaching the first polymer film 2p of the first member AP and the diced multilayer stack (the second member) BP together through the first adhesive layer 2a, the first polymer film 2p and the second multilayer stack BP can be attached together in a size of the foldable display; that is, a divided size. Such a feature can facilitate alignment adjustments, reduce faulty alignments, and improve yields.

Furthermore, at the step of forming the slits SL1 and SL2 in the method for manufacturing the foldable display, the slits SL1 and SL2 are punched out of the multilayer stack roll BP'R. Compared with a case of forming the slits by etching, such a feature allows the foldable display to be manufactured with lower costs.

As to the flexible display panels 4f to 4h included in the foldable display of this embodiment, and including: the impact absorbing layer 2' containing the metal film 2m; and the display layer 3, when the third region R3 overlapping with the folding mechanisms 7 and 8b in plan view is bent, peeling stress increases in regions positioned closer to the third region R3 and included in the first region R1 supported by the inflexible first support substrate 5 and in the second region R2 supported by the inflexible second support substrate 6. The slits SL1 and SL2 are formed in the metal film 2m in the regions exhibiting large peeling stress. Such a feature can alleviate the peeing stress, and the resulting foldable display is highly resistant to impact and bending.

Fifth Embodiment

Figure 18:
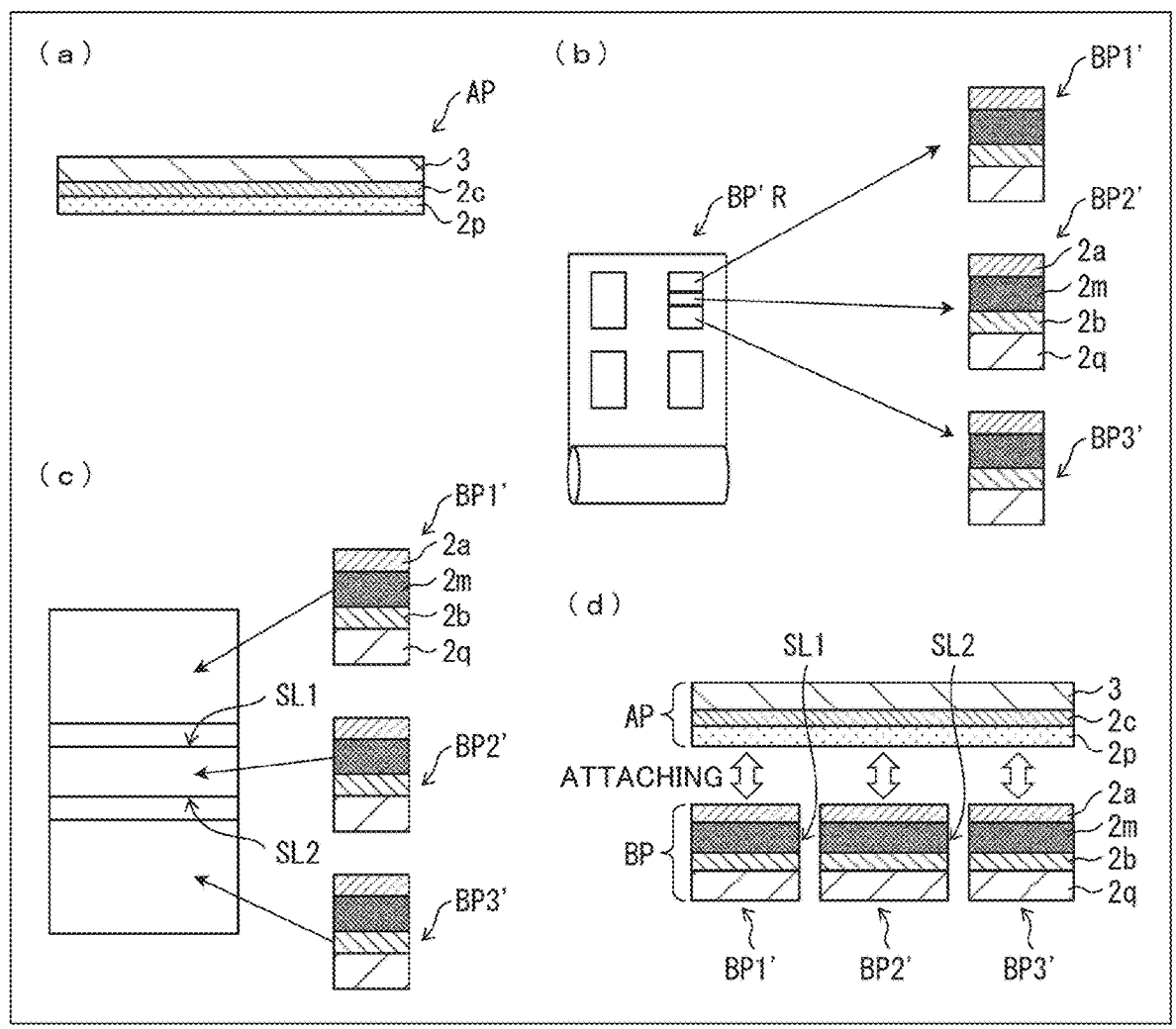
FIG. 18(a), FIG. 18(b), FIG. 18(c), and FIG. 18(d) are views showing an example of a method for manufacturing the foldable display including the flexible display panel illustrated in FIG. 17.
Figure 19:
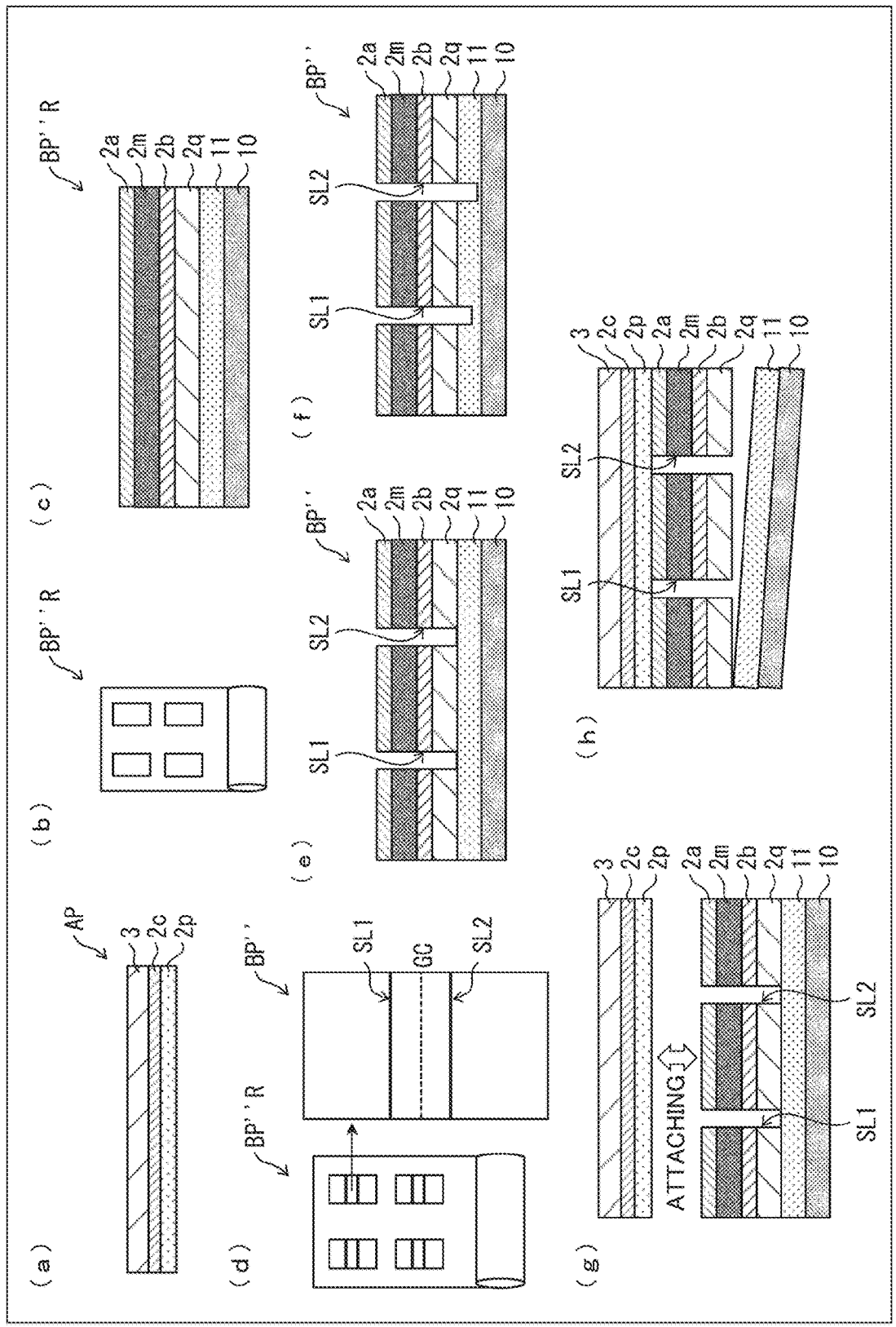
FIG. 19(a), FIG. 19(b), FIG. 19(c), FIG. 19(d), FIG. 19(e), FIG. 19(f), FIG. 19(g), and FIG. 19(h) are views showing another example of the method for manufacturing the foldable display including the flexible display panel illustrated in FIG. 17.

Next, a fifth embodiment of the disclosure is described below, with reference to FIGS. 17, 18, and 19. A flexible display panel 4i included in a foldable display of this embodiment is different from the foldable displays described in the third and fourth embodiments in that the flexible display panel 4i includes the impact absorbing layer 2' including: the third adhesive layer 2c; the first polymer film 2p; the first adhesive layer 2a; the metal film 2m; the second adhesive layer 2b; and the second polymer film 2q, and the slit SL1 and the slit SL2 are formed in the first adhesive layer 2a, the second adhesive layer 2b, the metal film 2m, and at least one of the first polymer film 2p or the second polymer film 2q. The other features are the same as those of the first to fourth embodiments. For convenience in description, like reference signs designate identical or corresponding constituent features between the drawings of this embodiment and the first to fourth embodiments. These constituent features will not be elaborated upon.

Figure 17:
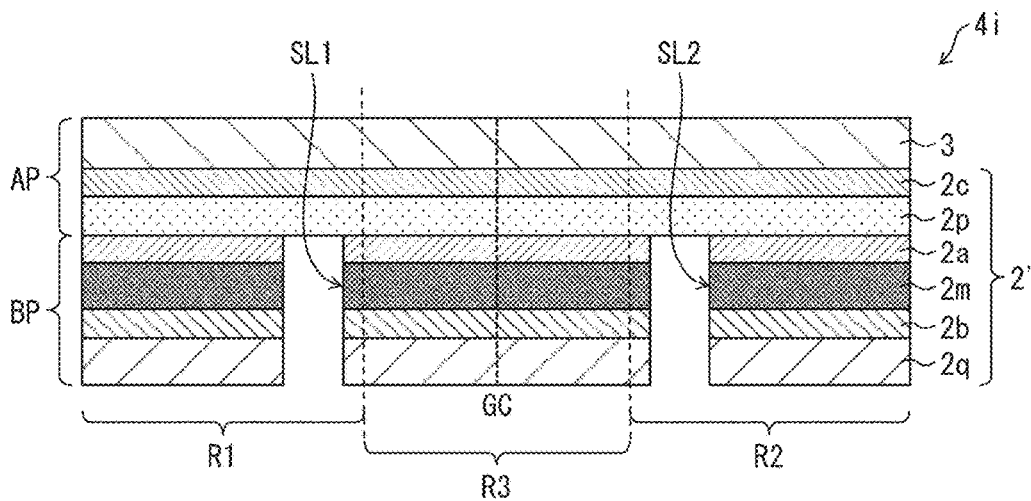
FIG. 17 is a cross-sectional view showing a schematic configuration of a flexible display panel included in a foldable display of a fifth embodiment.

FIG. 17 is a cross-sectional view showing a schematic configuration of the flexible display panel 4i included in the foldable display of the fifth embodiment.

FIG. 17 exemplifies a case where the flexible display panel 4i included in the foldable display of this embodiment includes the impact absorbing layer 2' including: the third adhesive layer 2c; the first polymer film 2p; the first adhesive layer 2a; the metal film 2m; the second adhesive layer 2b; and the second polymer film 2q, and the slit SL1 and the slit SL2 are formed in the first adhesive layer 2a, the second adhesive layer 2b, the metal film 2m, and the second polymer film 2q. However, the flexible display panel 4i shall not be limited to such an example. For example, the slit SL1 and the slit SL2 may be formed in the first adhesive layer 2a, the second adhesive layer 2b, the metal film 2m, and at least one of the first polymer film 2p or the second polymer film 2q.

FIG. 18(a), FIG. 18(b), FIG. 18(c), and FIG. 18(d) are views showing an example of a method for manufacturing the foldable display including the flexible display panel 4i illustrated in FIG. 17.

Note that the step of fastening in the method for manufacturing the foldable display has already been described in the first embodiment. Hence, described here is a step of forming the flexible display panel 4i alone.

The step of forming the flexible display panel 4i includes: a step of attaching the first polymer film 2p to a surface of the display layer 3 through the third adhesive layer 2c as illustrated in FIG. 18(a); and a step of forming the multilayer stack roll BP'R in which, as illustrated in FIG. 18(b), a roll of the second polymer film 2q is attached to a surface of a roll of the metal film 2m through the second adhesive layer 2b, and the first adhesive layer 2a is formed on another surface of the roll of the metal film 2m. Moreover, as illustrated in FIG. 18(b), the step of forming the flexible display panel 4i includes a step of dividing the multilayer stack roll BP'R into a plurality of multilayer stacks BP1', BP2', and BP3' so that, in regions included in the multilayer stack roll BP'R and each corresponding to the flexible display panel (each of the regions represented by solid lines in FIG. 18(b)), a sum of the areas of the plurality of multilayer stacks BP1', BP2', and BP3' obtained by the division is smaller than an area of the flexible display panel (an area represented by solid lines in FIG. 18(b)). That is, at the step of dividing the multilayer stack roll BP'R into a plurality of multilayer stacks BP1', BP2', and BP3', the widths of the slits SL1 and SL2 to be formed later (the vertical widths of the slits SL1 and SL2 illustrated in FIG. 18(c)) are taken into consideration, so that the sum of the areas of the plurality of multilayer stacks BP1', BP2', and BP3' obtained by the division is smaller than the area of the flexible display panel (the area represented by solid lines in FIG. 18(b)). Note that, at the step of dividing the multilayer stack roll BP'R into the plurality of multilayer stacks BP1', BP2' and BP3', the plurality of multilayer stacks BP1', BP2', and BP3' are punched out of the multilayer stack roll BP'R. Furthermore, as illustrated in FIG. 18(c) and FIG. 18(d), the step of forming the flexible display panel 4i includes a step of attaching the plurality of multilayer stacks BP1', BP2' and BP3' to the first polymer film 2p through the first adhesive layer 2a, and separating the plurality of the multilayer stacks BP1', BP2', and BP3' from one another by distances to form the slits SL1 and SL2. The first polymer film 2p is included in the first member AP including the display layer 3, the third adhesive layer 2c, and the first polymer film 2p.

The method for manufacturing the foldable display can form the flexible display panel 4i with a combination of punching out and attaching. Such a feature makes it possible to manufacture the foldable display relatively easily. Moreover, the feature can reduce capital-investment spending due to an increase in steps as to production of the impact absorbing layer 2'.

FIG. 19(a), FIG. 19(b), FIG. 19(c), FIG. 19(d), FIG. 19(e), FIG. 19(f), FIG. 19(g), and FIG. 19(h) are views showing another example of the method for manufacturing the foldable display including the flexible display panel 4i illustrated in FIG. 17.

Note that the step of fastening in the method for manufacturing the foldable display has already been described in the first embodiment. Hence, described here is a step of forming the flexible display panel 4i alone.

The step of forming the flexible display panel 4i includes: a step of attaching the first polymer film 2p to a surface of the display layer 3 through the third adhesive layer 2c as illustrated in FIG. 19(a); and a step of forming a multilayer stack roll BP"R in which, as illustrated in FIG. 19(b) and FIG. 19(c), a roll of the second polymer film 2q is attached to a surface of a roll of the metal film 2m through the second adhesive layer 2b, the first adhesive layer 2a is formed on another surface of the roll of the metal film 2m, and the roll of the second polymer film 2q and a base material 10 are attached together through a fourth adhesive layer 11 that is less adhesive than the first adhesive layer 2a, the second adhesive layer 2b, and the third adhesive layer 2c. Moreover, the step of forming the flexible display panel 4i includes: a step of dividing the metal film 2m into two in at least one of the first region R1 or the second region R2, and forming the slits SL1 and SL2 at least in the second adhesive layer 2b and the first adhesive layer 2a, in the metal film 2m, and in the second polymer film 2a, for regions included in the multilayer stack roll BP"R and each corresponding to the flexible display panel (each of the regions represented by solid lines in FIG. 19(d)); and a step of cutting, out of the multilayer stack roll BP"R in which the slits SL1 and SL2 are formed, the regions each corresponding to the flexible display panel, and obtaining a diced multilayer stack BP". The diced multilayer stack BP" as illustrated in FIG. 19(e) shows that the slits SL1 and SL2 are formed in the second adhesive layer 2b, the first adhesive layer 2a, the metal film 2m, and the second polymer film 2q. The diced multilayer stack BP′′′ as illustrated in FIG. 19(f) shows that the slits SL1 and SL2 are formed in the second adhesive layer 2b, the first adhesive layer 2a, the metal film 2m, the second polymer film 2q, and a portion of the fourth adhesive layer 11. Moreover, at the step of forming the slits SL1 and SL2, the base material 10 serves as a support substrate. Furthermore, at the step of forming the slits SL1 and SL2, the slits SL1 and SL2 may be formed also in a portion of the fourth adhesive layer 11 as illustrated in FIG. 19(f). Hence, the base material 10 and the fourth adhesive layer 11 can increase a margin of the step of forming the slits. Moreover, the step of forming the flexible display panel 4i includes: a step of attaching the first polymer film 2p and the diced multilayer stack (the second member) BP′′ together thorough the first adhesive layer 2a as illustrated in FIG. 19(g), the first polymer film 2p being included in the first member AP including the display layer 3, the third adhesive layer 2c, and the first polymer film 2p; and a step of removing the base material 10 and the fourth adhesive layer 11 from the second polymer film 2q of the diced multilayer stack BP′′ as illustrated in FIG. 19(h).

The method for manufacturing the foldable display can increase the margin of the step of forming the slits and improve yields.

SUMMARY

First Aspect

A foldable display, including: a flexible display panel including: an impact absorbing layer including a metal film; and a display layer provided on a surface of the impact absorbing layer;
  a first region, a second region, and a third region that are included in a region of the flexible display panel, the third region being positioned between the first region and the second region;
  a first support substrate that is inflexible, the first support substrate supporting the first region from toward the impact absorbing layer;
  a second support substrate that is inflexible, the second support substrate supporting the second region from toward the impact absorbing layer;
  a folding mechanism connected to the first support substrate and the second support substrate, and overlapping with the third region in plan view; and
  a slit provided to the metal film at least in a first position at a shortest distance, from the third region, shorter than a shortest distance from an end portion of the first region across from the third region, or in a second position at a shortest distance, from the third region, shorter than a shortest distance from an end portion of the second region across from the third region.

Second Aspect

In the foldable display according to the first aspect, the impact absorbing layer further includes at least a first adhesive layer provided to a surface of the metal film, or a second adhesive layer provided to another surface of the metal film, and
  the slit is provided to at least one of the first adhesive layer or the second adhesive layer, and the metal film.

Third Aspect

In the foldable display according to the first aspect, the impact absorbing layer further includes: a first polymer film provided to a surface of the metal film through a first adhesive layer; and a second polymer film provided to another surface of the metal film through a second adhesive layer, and
  the slit is provided to the first adhesive layer, the second adhesive layer, the metal film, and at least one of the first polymer film or the second polymer film.

Fourth Aspect

In the foldable display according to the third aspect, one of the first polymer film or the second polymer film contains at least one of polyimide, PET, PEN, COC, or aramid, and
  another one of the first polymer film or the second polymer film contains at least one of PET, urethane resin, polyester resin, acrylic resin, or polycarbonate resin.

Fifth Aspect

In the foldable display according to any one of the first to third aspects, the impact absorbing layer further includes: a first polymer film provided to a surface of the metal film through a first adhesive layer; and a second polymer film provided to another surface of the metal film through a second adhesive layer, and
  the second polymer film is formed of a foam disposed further away from the display layer than the first polymer film is.

Sixth Aspect

In the foldable display according to any one of the third to fifth aspects, the first polymer film is different in Young's modules from the second polymer film.

Seventh Aspect

In the foldable display according to any one of the third to sixth aspects, at least one of the first polymer film or the second polymer film is thicker than the metal film.

Eighth Aspect

In the foldable display according to any one of the first to seventh aspects, the slit is formed linearly along a bending center, of the third region, extending linearly.

Ninth Aspect

In the foldable display according to any one of the first to eighth aspects, the slit divides the metal film into two in at least one of the first region or the second region.

Tenth Aspect

In the foldable display according to any one of the first to eighth aspects, the slit includes a plurality of subslits, and
  the plurality of subslits are spaced apart from each other.

Eleventh Aspect

In the foldable display according to any one of the first to tenth aspects, the slit has a width perpendicular to a bending center, of the third region, extending linearly, the width being 500 μm or less.

Twelfth Aspect

In the foldable display according to any one of the first to eleventh aspects, each of the first region and the second region is in a non-bent state,
  the third region is in a first bent state in which a bending radius of the display layer is smaller than a bending radius of the impact absorbing layer, and
  the flexible display panel is folded in a U-shape.

Thirteenth Aspect

In the foldable display according to the twelfth aspect, the bending radius of the impact absorbing layer in the third region is R, and
  the slit is provided at a shortest distance from a bending center, of the third region, extending linearly, the shortest distance ranging from πE×R×0.5 to π×R×1.5.

Fourteenth Aspect

In the foldable display according to the thirteenth aspect, the slit is provided at the shortest distance from the bending center, of the third region, extending linearly, the shortest distance ranging from $\pi E \times R \times 0.5$ to $\pi \times R$.

Fifteenth Aspect

In the foldable display according to any one of the first to eleventh aspects, each of the first region and the second region is in a non-bent state,
- in the third region: a region from a bending center, of the third region, extending linearly is in a first bending state in which a bending radius of the display layer is smaller than a bending radius of the impact absorbing layer; and a remaining region is in a second bending state in which the bending radius of the display layer is larger than the bending radius of the impact absorbing layer, and
- the flexible display panel is folded in a droplet shape.

Sixteenth Aspect

In the foldable display according to the fifteenth aspect, the slit is provided in contact with a region included in the third region and observed in the second bending state.

Seventeenth Aspect

In the foldable display according to any one of the first to sixteenth aspect, the display layer further includes a sealing layer.

Eighteenth Aspect

In the foldable display according to any one of the first to seventeenth aspects, the metal film contains at least one of stainless steel, aluminum, titanium, or copper.

Nineteenth Aspect

In the foldable display according to any one of the first to eighteenth aspects, the metal film has a thickness of 10 μm or more and 100 μm or less.

Twentieth Aspect

A method for manufacturing a foldable display, the method including: a step of forming a flexible display panel including a display layer provided on a surface of an impact absorbing layer including a metal film; and
- a fastening step of fastening a first region of the flexible display panel to a first support substrate, which is inflexible, from toward the impact absorbing layer, and a second region of the flexible display panel to a second support substrate, which is inflexible, from toward the impact absorbing layer, and of overlapping a third region of the flexible display panel with a folding mechanism in plan view, the third region being positioned between the first region and the second region, and the folding mechanism being connected to the first support substrate and the second support substrate,
- wherein the step of forming the flexible display panel further includes a step of providing a slit to the metal film at least in a first position or a second position, the first position being at a shortest distance, from the third region, shorter than a shortest distance from an end portion of the first region across from the third region, and the second position being at a shortest distance, from the third region, shorter than a shortest distance from an end portion of the second region across from the third region.

Twenty First Aspect

In the method for manufacturing the foldable display according to the twentieth aspect, the step of forming the flexible display panel includes:
- a step of attaching a first polymer film to a surface of the display layer through a third adhesive layer;
- a step of forming the slit in regions included in a roll of the metal film and each corresponding to the flexible display panel, the slit including a plurality of subslits spaced apart from each other;
- a step of cutting, out of the roll of the metal film, the regions each corresponding to the flexible display panel, and obtaining a diced metal film;
- a step of cutting, out of a roll including at least a second polymer film, regions each corresponding to the flexible display panel, and obtaining a diced second polymer film;
- a step of attaching the diced metal film and the diced second polymer film together through a second adhesive layer; and
- a step of attaching a first member and a second member together through a first adhesive layer, the first member including the display layer, the third adhesive layer, and the first polymer film, the second member including the diced metal film, the second adhesive layer, and the diced second polymer film, and the first adhesive layer being provided to at least one of the first polymer film or the diced metal film.

Twenty Second Aspect

In the method for manufacturing the foldable display according to the twentieth aspect, the step of forming the flexible display panel includes:
- a step of attaching a first polymer film to a surface of the display layer through a third adhesive layer;
- a step of cutting, out of a roll of a metal film, regions each corresponding to the flexible display panel, and obtaining a diced metal film;
- a step of forming the slit in the diced metal film, the slit including a plurality of subslits spaced apart from each other;
- a step of cutting, out of a roll including at least a second polymer film, regions each corresponding to the flexible display panel, and obtaining a diced second polymer film;
- a step of attaching the diced metal film and the diced second polymer film together through the second adhesive layer; and
- a step of attaching a first member and a second member together through a first adhesive layer, the first member including the display layer, the third adhesive layer, and the first polymer film, the second member including the diced metal film, the second adhesive layer, and the diced second polymer film, and the first adhesive layer being provided to at least one of the first polymer film or the diced metal film.

Twenty Third Aspect

In the method for manufacturing the foldable display according to the twentieth aspect, the step of forming the flexible display panel includes:
- a step of attaching a first polymer film to a surface of the display layer through a third adhesive layer;
- a step of forming a multilayer stack roll in which a roll of a second polymer film is attached to a surface of a roll of a metal film through a second adhesive layer, and a first adhesive layer is formed on another surface of the roll of the metal film;
- a step of dividing the metal film into two in at least one of the first region or the second region, and forming the slit in the metal film and in at least one of the second adhesive layer or the first adhesive layer, for regions included in the multilayer stack roll and each corresponding to the flexible display panel;
- a step of cutting, out of the multilayer stack roll, the regions each corresponding to the flexible display panel, and obtaining a diced multilayer stack; and
- a step of attaching the first polymer film and the diced multilayer stack together through the first adhesive layer, the first polymer film being included in a first member including the display layer, the third adhesive layer, and the first polymer layer.

Twenty Fourth Aspect

In the method for manufacturing the foldable display according to the twentieth aspect, the step of forming the flexible display panel includes:
- a step of attaching a first polymer film to a surface of the display layer through a third adhesive layer;
- a step of forming a multilayer stack roll in which a roll of a second polymer film is attached to a surface of a roll of a metal film through a second adhesive layer, and a first adhesive layer is formed on another surface of the roll of the metal film;
- a step of dividing the multilayer stack roll into a plurality of multilayer stacks so that, in regions included in the multilayer stack roll and each corresponding to the flexible display panel, a sum of areas of the plurality of multilayer stacks obtained by the division is smaller than an area of the flexible display panel; and
- a step of attaching the plurality of multilayer stacks to the first polymer film through the first adhesive layer, and separating the plurality of the multilayer stacks from one another by distances to form the slit, the first polymer film being included in a first member including the display layer, the third adhesive layer, and the first polymer film.

Twenty Fifth Aspect

In the method for manufacturing the foldable display according to the twentieth aspect, the step of forming the flexible display panel includes:
- a step of attaching a first polymer film to a surface of the display layer through a third adhesive layer;
- a step of forming a multilayer stack roll in which a roll of a second polymer film is attached to a surface of a roll of a metal film through a second adhesive layer, a first adhesive layer is formed on another surface of the roll of the metal film, and the roll of the second polymer film and a base material are attached together through a fourth adhesive layer that is less adhesive than the first adhesive layer, the second adhesive layer, and the third adhesive layer;
- a step of dividing the metal film into two in at least one of the first region or the second region, and forming the slit at least in the second adhesive layer and the first adhesive layer, in the metal film, and in the second polymer layer, for regions included in the multilayer stack roll and each corresponding to the flexible display panel;
- a step of cutting, out of the multilayer stack roll, the regions each corresponding to the flexible display panel, and obtaining a diced multilayer stack;
- a step of attaching the first polymer film and the diced multilayer stack together thorough the first adhesive layer, the first polymer film being included in a first member including the display layer, the third adhesive layer, and the first polymer film; and
- a step of removing the base material and the fourth adhesive layer from the second polymer film of the diced multilayer stack.

Additional Remarks

The disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the disclosure.

Moreover, the technical aspects disclosed in each embodiment may be combined to achieve a new technical feature.

INDUSTRIAL APPLICABILITY

The disclosure is applicable to a foldable display and a method for manufacturing the foldable display.

The invention claimed is:

1. A foldable display, comprising:
a flexible display panel including: an impact absorbing layer including a metal film; and a display layer provided on a surface of the impact absorbing layer;
a first region, a second region, and a third region that are included in a region of the flexible display panel, the third region being positioned between the first region and the second region;
a first support substrate that is inflexible, the first support substrate supporting the first region from toward the impact absorbing layer;
a second support substrate that is inflexible, the second support substrate supporting the second region from toward the impact absorbing layer;
a folding mechanism connected to the first support substrate and the second support substrate, and overlapping with the third region in plan view; and
a slit provided to the metal film at least in a first position at a shortest distance, from the third region, shorter than a shortest distance from an end portion of the first region across from the third region, or in a second position at a shortest distance, from the third region, shorter than a shortest distance from an end portion of the second region across from the third region.

2. The foldable display according to claim 1,
wherein the impact absorbing layer further includes at least a first adhesive layer provided to a surface of the metal film, or a second adhesive layer provided to another surface of the metal film, and
the slit is provided to at least one of the first adhesive layer or the second adhesive layer, and the metal film.

3. The foldable display according to claim 1,
wherein the impact absorbing layer further includes: a first polymer film provided to a surface of the metal film through a first adhesive layer; and a second polymer film provided to another surface of the metal film through a second adhesive layer, and
the slit is provided to the first adhesive layer, the second adhesive layer, the metal film, and at least one of the first polymer film or the second polymer film.

4. The foldable display according to claim 3,
wherein one of the first polymer film or the second polymer film contains at least one of polyimide, PET, PEN, COC, or aramid, and
another one of the first polymer film or the second polymer film contains at least one of PET, urethane resin, polyester resin, acrylic resin, or polycarbonate resin.

5. The foldable display according to claim 1,
wherein the impact absorbing layer further includes: a first polymer film provided to a surface of the metal film through a first adhesive layer; and a second polymer film provided to another surface of the metal film through a second adhesive layer, and the second polymer film is formed of a foam disposed further away from the display layer than the first polymer film is.

6. The foldable display according to claim 3, wherein the first polymer film is different in Young's modules from the second polymer film.

7. The foldable display according to claim 3, wherein at least one of the first polymer film or the second polymer film is thicker than the metal film.

8. The foldable display according to claim 1, wherein the slit is formed linearly along a bending center, of the third region, extending linearly.

9. The foldable display according to claim 1, wherein the slit divides the metal film into two in at least one of the first region or the second region.

10. The foldable display according to claim 1, wherein the slit includes a plurality of subslits, and the plurality of subslits are spaced apart from each other.

11. The foldable display according to claim 1, wherein the slit has a width perpendicular to a bending center, of the third region, extending linearly, the width being 500 µm or less.

12. The foldable display according to claim 1, wherein each of the first region and the second region is in a non-bent state, the third region is in a first bent state in which a bending radius of the display layer is smaller than a bending radius of the impact absorbing layer, and the flexible display panel is folded in a U-shape.

13. The foldable display according to claim 12, wherein the bending radius of the impact absorbing layer in the third region is R, and the slit is provided at a shortest distance from a bending center, of the third region, extending linearly, the shortest distance ranging from $\pi \times R \times 0.5$ to $\pi \times R \times 1.5$.

14. The foldable display according to claim 13, wherein the slit is provided at the shortest distance from the bending center, of the third region, extending linearly, the shortest distance ranging from $\pi \times R \times 0.5$ to $\pi \times R$.

15. The foldable display according to claim 1, wherein each of the first region and the second region is in a non-bent state, in the third region: a region from a bending center, of the third region, extending linearly is in a first bending state in which a bending radius of the display layer is smaller than a bending radius of the impact absorbing layer; and a remaining region is in a second bending state in which the bending radius of the display layer is larger than the bending radius of the impact absorbing layer, and the flexible display panel is folded in a droplet shape.

16. The foldable display according to claim 15, wherein the slit is provided in contact with a region included in the third region and observed in the second bending state.

17. The foldable display according to claim 1, wherein the display layer further includes a sealing layer.

18. The foldable display according to claim 1, wherein the metal film contains at least one of stainless steel, aluminum, titanium, or copper.

19. The foldable display according to claim 1, wherein the metal film has a thickness of 10 µm or more and 100 µm or less.

20. A method for manufacturing a foldable display, the method comprising:
a step of forming a flexible display panel including a display layer provided on a surface of an impact absorbing layer including a metal film; and
a fastening step of fastening a first region of the flexible display panel to a first support substrate, which is inflexible, from toward the impact absorbing layer, and a second region of the flexible display panel to a second support substrate, which is inflexible, from toward the impact absorbing layer, and of overlapping a third region of the flexible display panel with a folding mechanism in plan view, the third region being positioned between the first region and the second region, and the folding mechanism being connected to the first support substrate and the second support substrate,
wherein the step of forming the flexible display panel further includes a step of providing a slit to the metal film at least in a first position or a second position, the first position being at a shortest distance, from the third region, shorter than a shortest distance from an end portion of the first region across from the third region, and the second position being at a shortest distance, from the third region, shorter than a shortest distance from an end portion of the second region across from the third region.

* * * * *